(12) United States Patent
Huisman et al.

(10) Patent No.: US 10,942,461 B2
(45) Date of Patent: Mar. 9, 2021

(54) ALIGNMENT MEASUREMENT SYSTEM

(71) Applicant: ASML Netherlands B.V., Veldhoven (NL)

(72) Inventors: Simon Reinald Huisman, Eindhoven (NL); Sebastianus Adrianus Goorden, Eindhoven (NL); Irwan Dani Setija, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/639,566

(22) PCT Filed: Jul. 2, 2018

(86) PCT No.: PCT/EP2018/067729
§ 371 (c)(1),
(2) Date: Feb. 15, 2020

(87) PCT Pub. No.: WO2019/034318
PCT Pub. Date: Feb. 21, 2019

(65) Prior Publication Data
US 2020/0241433 A1      Jul. 30, 2020

(30) Foreign Application Priority Data

Aug. 16, 2017    (EP) ..................................... 17186443
Feb. 22, 2018    (EP) ..................................... 18158094

(51) Int. Cl.
*G03F 9/00*           (2006.01)
(52) U.S. Cl.
CPC .................. *G03F 9/7069* (2013.01)
(58) Field of Classification Search
CPC .. G03F 7/7085; G03F 7/70191; G03F 9/7069; G01N 21/9501; G01N 21/956
(Continued)

(56) References Cited

U.S. PATENT DOCUMENTS 5,982,482 A    11/1999  Nelson et al.
6,704,089 B2    3/2004  Van Der Schaar et al.
(Continued)

FOREIGN PATENT DOCUMENTS

EP       1 150 173 A2    10/2001
JP           2937171 B2    8/1999
JP       2001-267224 A    9/2001

OTHER PUBLICATIONS

International Search Report and Written Opinion of the International Searching Authority directed to related International Patent Application No. PCT/EP2018/067729, dated Oct. 30, 2018; 11 pages.
(Continued)

*Primary Examiner* — Hung Nguyen
(74) *Attorney, Agent, or Firm* — Sterne, Kessler, Goldstein & Fox P.L.L.C.

(57) ABSTRACT

An apparatus for determining a characteristic of a feature of an object comprises: a measurement radiation source; a measurement radiation delivery system; a measurement system; a pump radiation source; and a pump radiation delivery system. The measurement radiation source is operable to produce measurement radiation and the measurement radiation delivery system is operable to irradiate at least a part of a top surface of the object with the measurement radiation. The measurement system is operable to receive at least a portion of the measurement radiation scattered from the top surface and is further operable to determine a characteristic of the feature of the object from at least a portion of the measurement radiation scattered from the top surface. The pump radiation source is operable to produce pump radiation and the pump radiation delivery system is operable to irradiate at least a part of the top surface of the object with
(Continued)

the pump radiation so as to produce a mechanical response (for example an acoustic wave) in the object.

18 Claims, 10 Drawing Sheets

(58) Field of Classification Search
USPC .................................................... 356/237.2
See application file for complete search history.

(56) References Cited

U.S. PATENT DOCUMENTS

| | | | |
|---|---|---|---|
| 6,961,116 B2 | 11/2005 | Den Boef et al. | |
| 7,397,596 B2 | 7/2008 | Yacoubian | |
| 2002/0006560 A1 | 1/2002 | Van Der Schaar et al. | |
| 2009/0195768 A1 | 8/2009 | Bijnen et al. | |
| 2012/0212749 A1 | 8/2012 | Den Boef et al. | |
| 2013/0016346 A1* | 1/2013 | Romanovsky | G01N 21/956 356/237.5 |
| 2015/0109624 A1 | 4/2015 | Kreuzer et al. | |
| 2015/0227061 A1 | 8/2015 | Tinnemans et al. | |
| 2016/0223920 A1 | 8/2016 | Tinnemans et al. | |
| 2017/0184977 A1* | 6/2017 | Jak | G03F 7/7085 |
| 2019/0302570 A1* | 10/2019 | Kumar | G02F 1/365 |

OTHER PUBLICATIONS

International Preliminary Report on Patentability directed to related International Patent Application No. PCT/EP2018/067729, dated Feb. 18, 2020; 8 pages.

Huijbregtse et al., "Overlay Performance with Advanced ATHENA™ Alignment Strategies," Metrology, Inspection, and Process Control for Microlithography XVII, Proceedings of SPIE, vol. 5038, Jun. 2, 2003; pp. 918-928.

Ruello et al., "Physical mechanisms of coherent acoustic phonons generation by ultrafast laser action," Ultrasonics, vol. 56, 2015; pp. 21-35.

* cited by examiner

ALIGNMENT MEASUREMENT SYSTEM

CROSS-REFERENCE TO RELATED APPLICATIONS

This application claims priority of EP application 17186443.2 which was filed on 16 Aug. 2017 and EP application 18158094.5 which was filed on 22 Feb. 2018 and which is incorporated herein in its entirety by reference.

FIELD

The present invention relates to methods and apparatus for determining a characteristic of a feature of an object, the feature being disposed below, on or proximate to a top surface of the object. In particular, but not exclusively, it may relate to the determination of the position of an alignment mark using an alignment measurement system. The invention may, for example, form part of an alignment system, or other position measurement system, within a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging the pattern onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, alignment marks are generally provided on the substrate, and the lithographic apparatus includes one or more alignment measurement systems by which positions of alignment marks on a substrate can be measured accurately. These alignment measurement systems are effectively position measuring apparatuses. Various different types of alignment marks and different types of alignment measurement systems are known. Generally, an alignment measurement system measures the position of an alignment mark by irradiating it with a measurement radiation beam, receiving at least a portion of the measurement radiation beam scattered from the alignment mark and determining a position of the alignment mark from this scattered radiation.

There is continually a need to provide more accurate position measurements, especially to control overlay errors as product features get smaller and smaller.

As an integrated circuit is fabricated on a silicon wafer, the alignment marks can buried by various layers of the integrated circuit. The thicknesses and optical properties of these layers can vary according to the type of integrated circuit and the process applied to manufacture the integrated circuit. One or many of these layers can be opaque and, as a result, a measurement radiation beam may not be able to penetrate through the layers and reach the alignment mark. This represents a big obstacle for state of the art optical alignment methods.

It is an object of the present invention to provide alternative methods and apparatus that are suitable for determining a characteristic of a feature in an object (for example the position of an alignment mark) which at least partially address one or more problems associated with prior art arrangements, whether identified here or not.

SUMMARY

According to a first aspect of the invention, there is provided an apparatus for determining a characteristic of a feature of an object, the apparatus comprising: a measurement radiation source operable to produce measurement radiation; a measurement radiation delivery system operable to irradiate at least a part of a top surface of the object with the measurement radiation; a measurement system operable to receive at least a portion of the measurement radiation scattered from the top surface and further operable to determine a characteristic of the feature of the object from at least a portion of the measurement radiation scattered from the top surface; a pump radiation source operable to produce pump radiation; and a pump radiation delivery system operable to irradiate at least a part of the top surface of the object with the pump radiation so as to produce a mechanical response in the object.

The apparatus according to the first aspect of the invention provides an apparatus (which may function as a position detector or alignment system) that can be used to determine a characteristic of a feature of an object (for example a position of the feature) in two different operational modes, as now discussed.

The feature may be disposed on or below the top surface of the object.

The apparatus according to the first aspect of the invention may be operable to determine the characteristic of the feature using the measurement radiation that has directly scattered from the feature. This may be referred to as a first operational mode. The first operational mode may be used, for example, when the feature is disposed on or proximate to the top surface. In this context, it will be appreciated that the feature being disposed on or proximate to the top surface may mean that the feature is within a region of the object that the measurement radiation can penetrate to from the top surface.

Additionally or alternatively, the apparatus according to the first aspect of the invention may be operable to determine the characteristic of the feature using both the pump radiation and the measurement radiation as a pump-probe arrangement. First the pump radiation is used to produce a mechanical response in the object. The mechanical response may, for example, be a mechanical wave. It will be appreciated that such mechanical waves may comprise acoustic waves or any other propagation of heat such as, for example, diffusion of free electrons. The mechanical wave generated by the pump radiation may propagate through the object and a portion of it may be scattered by the feature and propagate back to the top surface. Subsequently, the measurement radiation is used to probe the top surface of the object so as to indirectly determine one or more characteristics of the feature. This may be referred to as a second operational mode. The second operational mode may be used, for example, when the feature is disposed below the top surface and, in particular, when an opaque material (for example an opaque layer formed from metal) is disposed between the top surface and the feature.

The apparatus according to the first aspect of the invention therefore provides an arrangement that can be operated in either one of the first and second operational modes. This arrangement therefore optionally provides the functionality of the second operational mode in addition to the first operational mode, which is typically provided by prior art position detectors.

Furthermore, the apparatus according to the first aspect of the invention comprises both a measurement radiation delivery system and a pump radiation delivery system. Therefore, the apparatus comprises two different radiation delivery systems (the measurement radiation delivery system and the pump radiation delivery system). Such an arrangement is advantageous over an arrangement wherein a pump radiation and a measurement radiation share a common delivery system for a number of reasons, as now discussed.

Operation in the second operational mode is advantageous since it allows measurement of a characteristic of a feature even when an opaque material is disposed between the top surface and the feature. However, when the feature is disposed on or proximate to the top surface better accuracy may be achieved by using the first operational mode. Therefore, it may be desirable to be able to switch between the first and second operational modes. When operating in the first operational mode the pump radiation source is switched off and when operating in the second operational mode the pump radiation source is switched on.

In order to generate mechanical waves (for example acoustic waves) in the object, the intensity of the pump radiation source is typically high. In turn, the typical intensity of the pump radiation (typically comprising a series of laser pulses) that is required to induce the mechanical waves can cause significant heating. Therefore, when operating in the second operational mode, the pump radiation may cause significant thermal expansion of the delivery system used by the pump radiation. However, when operating in the first operational mode, such heating and resultant thermal expansion of the delivery system used by the pump radiation is absent. If the pump radiation and the measurement radiation share a common delivery system then there would be a significant difference in the delivery system when operating in the first and second operational modes due to the different levels of thermal expansion. In turn, this affects the measurement radiation (which shares the common delivery system) and the determined characteristic of the feature derived from the scattered measurement radiation. The apparatus according to the first aspect of the invention avoids this problem.

In addition, by providing the pump radiation via a separate pump radiation delivery system, the apparatus according to the first aspect of the invention provides an arrangement that allows a pump radiation source and pump radiation delivery system to be retrofitted to existing alignment sensors in an easy way. This can allow existing alignment systems to be upgraded so as to provide the additional functionality of the second operational mode whilst minimizing cost and effort.

The apparatus may be a position detector and/or part of an alignment system. The object may, for example, be a silicon wafer. The feature may be an alignment mark. The alignment mark may be of the form of a reflective grating. The characteristic of the feature may be a position of the feature, for example, in a plane generally parallel to the top surface.

The measurement system may comprise a sensor and a processor. The sensor may be operable to detect radiation scattered from the top surface and to output a signal containing information related to a position of the feature. The processor may be configured to receive the signal from the sensor and to determine a position of the feature, for example relative to a substrate table, in dependence thereon.

It will be appreciated that an apparatus comprising both a measurement radiation delivery system and a pump radiation delivery system is intended to mean an apparatus that comprises two different radiation delivery systems (the measurement radiation delivery system and the pump radiation delivery system). It will be further appreciated that by this is meant that at least part of the measurement radiation delivery system is separate or distinct from at least part of the pump radiation delivery system. However, it will be appreciated that the measurement radiation delivery system and the pump radiation delivery system may share one or more common elements. Alternatively, in some embodiments the measurement radiation delivery system and the pump radiation delivery system may share no common elements. In particular, it is intended that an apparatus comprising both a measurement radiation delivery system and a pump radiation delivery system means that at least a part of the measurement radiation delivery system that is closest to the object is separate or distinct from at least part of the pump radiation delivery system that is closest to the object.

In order to generate a mechanical response in the object, the pump radiation may have an intensity that varies with time. For example, the pump radiation may be a pulsed radiation beam. It will be appreciated that, in general, the pump radiation may have an intensity that has any time modulation.

The measurement radiation delivery system and the pump radiation delivery system may be configured such that an angle of incidence of the pump radiation at an object plane is different from an angle of incidence of the measurement radiation at the object plane.

It will be appreciated that, in use, the apparatus is used to determining a characteristic of a feature of an object. To achieve this, in use, an object may be disposed such that the measurement radiation delivery system can irradiate the top surface of the object with the measurement radiation and the pump radiation delivery system can irradiate the top surface of the object with the pump radiation. The object plane may be a plane in which the top surface of the object is disposed in use.

The pump radiation delivery system may be configured such that the pump radiation is incident on an object plane at a non-zero angle of incidence.

Typically in pump-probe arrangements both the pump radiation and the probe radiation are normally incident on the object (i.e. incident with a zero angle of incidence). Furthermore, in the context of a position measurement system, the skilled person would recognise that it is important that the mechanical waves (for example acoustic waves) generated in the object propagate generally perpendicularly to the top surface of the object (both away from the top surface to the feature and back to the top surface). This can allow the shape of the feature (for example a reflective diffraction grating), or at least for a distorted copy of the feature, to be reproduced at substantially the same position (in a plane parallel to the top surface) on the top surface. The skilled person would not consider illuminating the top surface of the object with pump radiation at a non-zero angle of incidence since the skilled person may expect this to produce mechanical waves that do not propagate perpendicularly to the top surface.

However, contrary to this prejudice, the inventors of the present invention have realised that even if the pump radiation is incident at a non-zero angle of incidence, the generated acoustic waves that are excited in the object will still travel perpendicularly to the top surface of the object. This is because the speed of sound in the object (of the order of several thousand m/s) is 5 orders of magnitude smaller than the speed of light.

Having the pump radiation delivery system configured such that the pump radiation is incident on an object plane at a non-zero angle of incidence allows the measurement radiation delivery system to be configured such that the measurement radiation is normally incident on the object (i.e. incident with a zero angle of incidence). This may be advantageous in order to ensure that certain diffraction orders interfere with each other and/or so that the measurement system works for features or alignment marks with a range of different pitches.

The pump radiation delivery system may comprise an optical fiber.

The apparatus may further comprise a controller. The controller may be operable to control the measurement radiation source and the pump radiation source. The controller may be operable to operate in either a first operational mode wherein the pump radiation source is not producing pump radiation or a second operational mode wherein the pump radiation source is producing pump radiation at least part of the time.

It will be appreciated that in this context, when the controller is operating in the second operational mode, the pump radiation source may be producing pump radiation intermittently. The pump radiation may comprise a pulsed laser beam.

The measurement radiation source may be operable to produce first measurement radiation or second measurement radiation and wherein the controller is operable to control the measurement radiation source to produce the first measurement radiation when operating in the first operational mode and to control the measurement radiation source to produce the second measurement radiation when operating in the second operational mode.

Typically the pump radiation source may comprise an ultrafast laser, which can generate acoustic waves inside a variety of different materials. It will be appreciated by the skilled person that in this context the term ultrafast laser means a laser that outputs pulses with a relatively small temporal duration. The term ultrafast laser may include lasers which are operable to output pulses with a temporal duration of the order of nanoseconds, picoseconds, femtoseconds or less. The ultrafast laser may, for example, be operable to output pulses with a temporal duration of the order of tens of picoseconds or less. Such ultrafast lasers are typically mode-locked lasers. When operating in the second mode the measurement radiation may comprise pulses with substantially the same temporal duration as the pump radiation. This may be the second measurement radiation. When operating in the first mode the measurement radiation may comprise pulses with a different temporal duration to the pulses of the pump radiation.

An angular distribution of measurement radiation from which the measurement radiation system determines the characteristic of the feature of the object may be controllable.

The feature may be generally of the form of a reflective diffraction grating that is configured to scatter the measurement radiation into a plurality of diffraction orders. Information about the characteristic of the feature (for example the position of the feature) may be contained in the $\pm n^{th}$ diffraction orders, where n=1,2,3 . . . . Any other radiation that is scattered from the object may form a background to this signal which may affect the accuracy with which the characteristic can be determined. Such scattered radiation that may form a background to the signal may include any specular reflection (which may be considered to form a $0^{th}$ order diffraction beam) and/or diffuse reflection. It may therefore be desirable to provide a zero order stop arranged to block radiation that is scattered from the object in a range of angles centered in the direction of a specular reflection beam (or, equivalently, a $0^{th}$ order diffraction beam). This may be referred to as a pupil filter. The zero order stop or pupil filter may be adjustable.

The controller may be operable to control the angular distribution of measurement radiation from which the measurement radiation system determines the characteristic of the feature of the object such that the characteristic of the feature of the object is determined from a first angular distribution when the controller is operating in the first operational mode and from a second angular distribution when the controller is operating in the second operational mode.

When the controller is operating in the second operational mode, the measurement radiation is not probing the feature directly but rather is probing a signal formed on the top surface by a mechanical wave scattered from the feature. The signal received by the measurement radiation system when the controller is operating in the second operational mode may therefore be reduced relative to the signal received by the measurement radiation system when the controller is operating in the first operational mode. Therefore, it may be advantageous, for example, to increase the size of a zero order block when operating in the second operational mode so as to enhance a signal to background ratio of the measurement.

A sensitivity of a sensor of the measurement system to noise may be controllable.

The sensor may be operable to detect measurement radiation scattered from the top surface and to output a signal containing information related to a position of the feature. Typically, the sensor may comprise an array of sensing elements. The sensor may comprise control electronics that may comprise a feedback resistor. The sensitivity of the sensor of the measurement system to noise may be dependent on the resistance of the feedback resistor. A variable resistor or a system of resistors and switches may be provided to allow the feedback resistance to be controlled.

The controller may be operable to control the sensitivity of the sensor of the measurement system to noise such that the sensor has a first sensitivity to noise when the controller is operating in the first operational mode and the sensor has a second sensitivity to noise when the controller is operating in the second operational mode.

As explained above, the signal received by the measurement radiation system when the controller is operating in the second operational mode may be reduced relative to the signal received by the measurement radiation system when the controller is operating in the first operational mode. Therefore, it may be advantageous, for example, to reduce the sensitivity of the sensor of the measurement system to noise when operating in the second operational mode so as to enhance a signal to background ratio of the measurement.

The measurement radiation delivery system may comprise an interferometer having a first optical path and a second optical path. The interferometer may comprise a polarization independent beam splitter arranged to: receive the measurement radiation from the measurement radiation source; generate from the measurement radiation: a first portion that is directed to along the first optical path then irradiates, and scatters from, a surface of the object, and is then directed along the second optical path; and a second portion that is directed to along the second optical path then irradiates, and scatters from, a surface of the object, and is then directed along the first optical path; and recombine the first and second portions of the measurement radiation to form output radiation. The characteristic of the feature of the object may be determined in dependence on said output radiation.

According to a second aspect of the invention there is provided a lithography apparatus comprising the apparatus of the first aspect of the invention.

According to a third aspect of the invention there is provided a method for determining a characteristic of a feature of an object, the method comprising selecting either a first operational mode or a second operational mode, wherein when the first operational mode is selected, at least a part of a top surface of the object is irradiated with a measurement radiation using a measurement radiation delivery system, and wherein when the second operational mode is selected, at least a part of the top surface of the object is irradiated with a pump radiation using a pump radiation delivery system so as to produce a mechanical response in the object before the top surface of the object is irradiated with the measurement radiation; receiving at least a portion of the measurement radiation scattered from the top surface; and determining a characteristic of the feature of the object from at least a portion of the measurement radiation scattered from the top surface.

The method according to the third aspect of the invention provides two different operational modes.

When the top surface of the object is irradiated by the pump radiation an angle of incidence of the pump radiation at the top surface of the object may be different from an angle of incidence of the measurement radiation at the top surface of the object.

When the top surface of the object is irradiated by the pump radiation, the pump radiation may be incident on the top surface of the object at a non-zero angle of incidence.

When the first operational mode is selected, the top surface of the object may be irradiated by a first measurement radiation and when the second operational mode is selected, the top surface of the object may be irradiated by a second measurement radiation.

When the first operational mode is selected the characteristic of the feature of the object may be determined from a first angular distribution of measurement radiation; and when the second operational mode is selected the characteristic of the feature of the object may be determined from a second angular distribution of measurement radiation.

A sensitivity of a sensor used in the determination of the characteristic of the feature of the object of the measurement system to noise may be selected in dependence on which of the first and second operational modes is selected.

According to a fourth aspect of the invention there is provided an apparatus for determining a characteristic of a feature of an object, the apparatus comprising: a measurement radiation source operable to produce measurement radiation; a polarization independent interferometer having a first optical path and a second optical path, the interferometer comprising a polarization independent beam splitter arranged to: receive the measurement radiation from the measurement radiation source; generate from the measurement radiation: a first portion that is directed to along the first optical path then irradiates, and scatters from, a surface of the object, and is then directed along the second optical path; and a second portion that is directed to along the second optical path then irradiates, and scatters from, a surface of the object, and is then directed along the first optical path; and recombine the first and second portions of the measurement radiation to form output radiation; a pump radiation source operable to produce pump radiation for irradiating the top surface of the object with the pump radiation so as to produce a mechanical response in the object; and a measurement system operable to receive the output radiation and to determine a characteristic of the feature of the object in dependence thereon.

The apparatus according to the fourth aspect of the invention provides an apparatus (which may function as a position detector or alignment system) that can be used to determine a characteristic of a feature of an object (for example a position of the feature). The apparatus according to the fourth aspect of the invention may be operable to determine the characteristic of the feature using both the pump radiation and the measurement radiation as a pump-probe arrangement. The pump radiation is used to produce a mechanical response in the object. The mechanical response may, for example, be a mechanical wave. It will be appreciated that such mechanical waves may comprise acoustic waves or any other propagation of heat such as, for example, diffusion of free electrons. The mechanical wave generated by the pump radiation may propagate through the object and a portion of it may be scattered by the feature and propagate back to the top surface. The measurement radiation is used to probe the top surface of the object so as to indirectly determine one or more characteristics of the feature. This pump-probe arrangement may be used, for example, when the feature is disposed below the top surface and, in particular, when an opaque material (for example an opaque layer formed from metal) is disposed between the top surface and the feature.

By directing the first and second portions of the measurement radiation along two different paths, each formed from the same component optical paths but in a different order, the measurement radiation can be incident on the surface of the object at two different times and then be combined to interfere. For example, the first portion of the measurement radiation may be incident on the surface before pump radiation from the pump radiation source is incident on the surface whereas the second portion of the measurement radiation may be incident on the surface after pump radiation from the pump radiation source is incident on the surface. With such an arrangement, the first portion of the measurement radiation may contain information dependent on a generally time-independent surface topography of the object whereas the second portion of the measurement radiation may contain information dependent on both this generally time-independent surface topography of the object and on a time dependent signal generated by an acoustic echo from a generated mechanical wave. By combining these two portions of the measurement radiation source, it may be possible to separate the time dependent signal generated by an acoustic echo from a generated mechanical wave from the generally time-independent surface topography of the object.

Advantageously, by using an interferometer comprising a beam splitter that is polarization independent, the interferometer is insensitive to any changes in the polarisation state caused by any optics used to either irradiate the surface of the object or to collect the radiation scattered by the object. Furthermore, it allows the first and second portions of the input measurement radiation (which are formed using the interferometer) to enter alignment sensor optics with the same polarization. This is particularly advantageous since it allows the interferometer to be combined with optics for existing position detectors which may alter the polarization state of an input measurement radiation beam and/or whose output may be dependent on the polarization state of an input radiation beam.

The apparatus may be a position detector and/or part of an alignment system. The object may, for example, be a silicon wafer. The feature may be an alignment mark. The alignment mark may be of the form of a reflective or diffractive grating. The characteristic of the feature may be a position of the feature, for example, in a plane generally parallel to the top surface.

The first optical path may be a two-way optical path defined between the polarization independent beam splitter and a first reflective optical element. The second optical path may be a two-way optical path defined between the polarization independent beam splitter and a second reflective optical element. When the first and second portions propagate from the polarization independent beam splitter, irradiate, and scatter from, the surface of the object, and propagate back to the polarization independent beam splitter they may be considered to propagate along a third optical path.

According to a fifth aspect of the invention there is provided a method for determining a characteristic of a feature of an object, the method comprising: producing measurement radiation; directing the measurement radiation to a polarization independent interferometer having a first optical path and a second optical path, the interferometer comprising a polarization independent beam splitter; generating from the measurement radiation: a first portion that is directed to along the first optical path then irradiates, and scatters from, a surface of the object, and is then directed along the second optical path; and a second portion that is directed to along the second optical path then irradiates, and scatters from, a surface of the object, and is then directed along the first optical path; and producing pump radiation and irradiating the top surface of the object with the pump radiation so as to produce a mechanical response in the object, the pump radiation irradiating the surface of the object after the first portion of the measurement radiation and before the second portion of the measurement radiation; recombining the first and second portions of the measurement radiation to form output radiation; and determining a characteristic of the feature of the object in dependence on a temporal portion of the output radiation, the temporal portion corresponding to a portion of the output radiation that corresponds to a time taken to propagate along the first optical path, irradiate and scatter from the surface of the object, and propagate along the second optical path.

When the first and second portions propagate from the polarization independent beam splitter, irradiate, and scatter from, the surface of the object, and propagate back to the polarization independent beam splitter they may be considered to propagate along a third optical path.

It will be appreciated that the time taken for the measurement radiation to propagate along the first optical path, irradiate and scatter from the surface of the object, and propagate along the second optical path will be dependent on the total optical path length of the first, second and third optical paths and the propagation speed of the measurement radiation. It will be further appreciated that it will take a non-zero the time for the measurement radiation to propagate from a measurement radiation source to the polarization independent beam splitter, said time being dependent on the total optical path length between the measurement radiation source and the polarization independent beam splitter (and the propagation speed of the measurement radiation). It will be further appreciated that it will take a non-zero the time for the output radiation to propagate from the polarization independent beam splitter to a detector or sensor, said time being dependent on the total optical path length between the polarization independent beam splitter and said detector or sensor (and the propagation speed of the measurement radiation).

It will be appreciated that a portion of the output radiation that corresponds to a time taken to propagate along the first optical path, irradiate and scatter from the surface of the object, and propagate along the second optical path is intended to mean a part of the output radiation that is received (for example by a sensor or detector) some time after it is generated (for example by a measurement radiation source), that time corresponding to the time taken to propagate from the measurement radiation source to the beam splitter, along the first, second and third optical paths and then from the beam splitter to the detector or sensor.

The method according to the fifth aspect of the invention may be a method of using the apparatus according to the fourth aspect of the invention. This pump-probe method may be used, for example, when the feature is disposed below the top surface and, in particular, when an opaque material (for example an opaque layer formed from metal) is disposed between the top surface and the feature.

The first portion of the measurement radiation may contain information dependent on a generally time-independent surface topography of the object whereas the second portion of the measurement radiation may contain information dependent on both this generally time-independent surface topography of the object and on a time dependent signal generated by an acoustic echo from a generated mechanical wave. By combining these two portions of the measurement radiation source, it may be possible to separate the time dependent signal generated by an acoustic echo from a generated mechanical wave from the generally time-independent surface topography of the object.

It will be appreciated that by using an interferometer comprising a beam splitter that is polarization independent, each time a portion of the measurement radiation is incident on the beam splitter a first fraction (for example approximately half) of the incident radiation will be directed along a first path and a second fraction (for example approximately half) of the incident radiation will be directed along a second path. For example, when the measurement radiation is incident on the beam splitter a first time, approximately half of the measurement radiation will be directed along the first optical path and approximately half of the incident radiation will be directed along the second optical path. Each of the first and second optical paths comprises a two-way optical path defined between the beam splitter and a reflective optical element. When the portion of the measurement radiation, that was directed along the first optical path, returns to the beam splitter approximately half of the incident radiation will be directed along the third optical path and approximately half of the incident radiation will be output by the system. When the portion of the measurement radiation, that was directed along the second optical path, returns to the beam splitter approximately half of the incident radiation will be directed along the third optical path and approximately half of the incident radiation will be output by the system. When the portions of the measurement radiation, that were directed along the third optical path, return to the beam splitter approximately half of the incident radiation will be directed along the first optical path and approximately half of the incident radiation will be directed along the second optical path. It will be appreciated that by using an interferometer comprising a beam splitter that is polarization independent there will be a plurality of portions of measurement radiation that are output by the system and that, in general, these portions of measurement radiation are output by the system at different times. By determining the characteristic of the feature of the object in dependence on a temporal portion of the output radiation that corresponds to a portion of the output radiation that corresponds to a time taken to propagate along the first optical path, irradiate and scatter from the surface of the object, and propagate along the second optical path, the method can separate out a time dependent signal generated by an acoustic echo from a generated mechanical wave from a generally time-independent surface topography of the object.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1B:
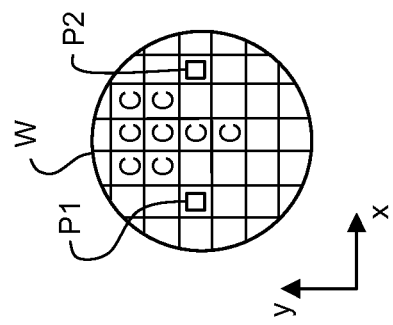
FIG. 1B shows a plan view of a substrate W which may represent either of the two substrates of FIG. 1A.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way that depends on the orientation of the patterning device, the design of the lithographic apparatus, and other conditions, such as, for example, whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The term "illumination system" used herein may encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1C:
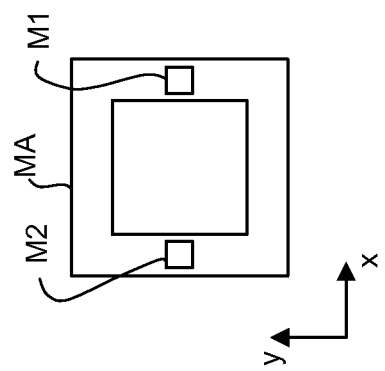
FIG. 1C shows a plan view of a patterning device, which may be used by the lithographic system of FIG. 1A.
Figure 1A:
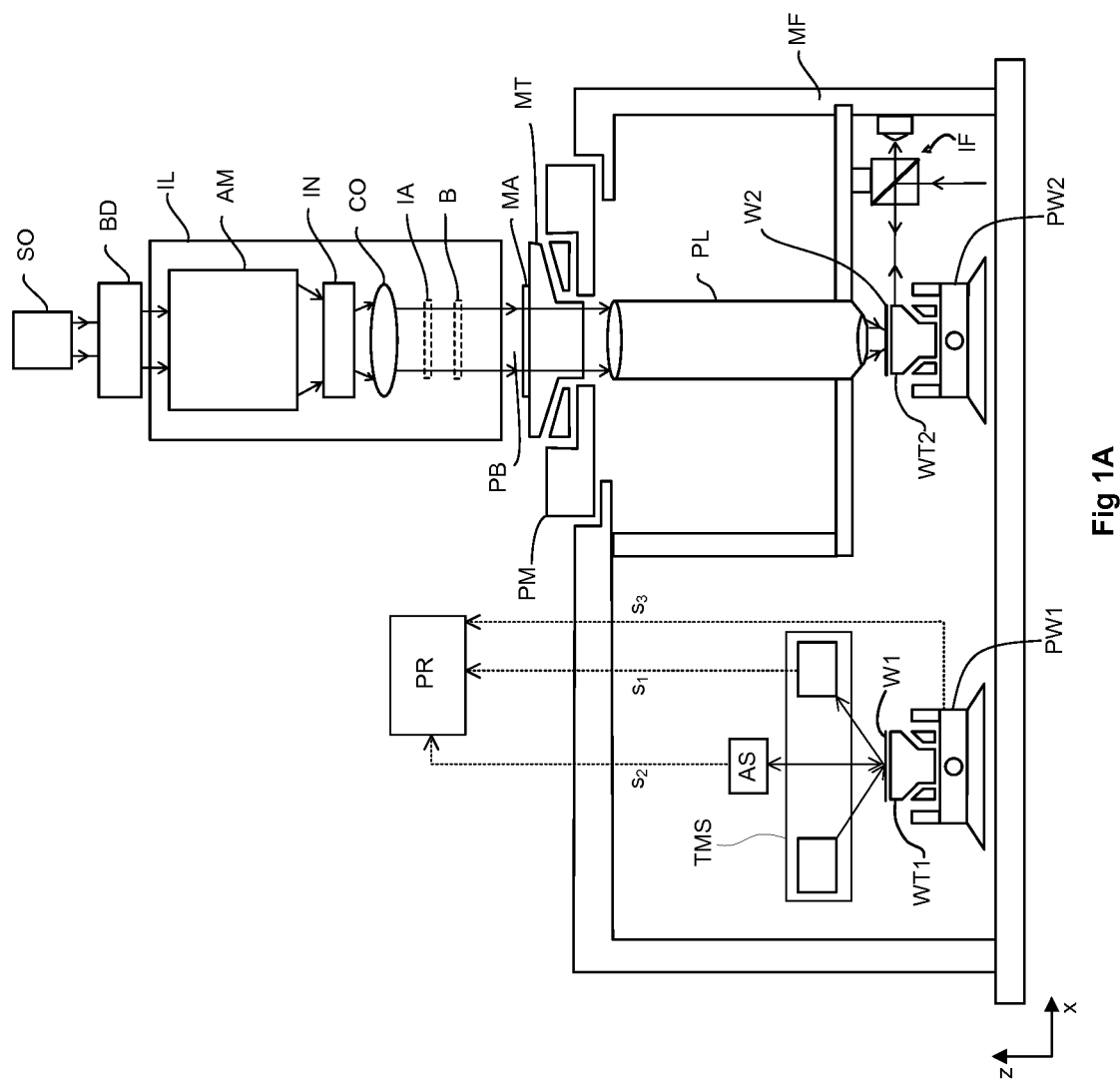
FIG. 1A schematically depicts a lithographic system comprising an alignment system according to an embodiment of the invention.

FIG. 1A schematically depicts a lithographic apparatus according to a particular embodiment of the invention. The apparatus comprises:
 an illumination system (illuminator) IL for conditioning a beam PB of radiation (e.g. UV radiation or DUV radiation);
 a frame MF;
 a support structure (e.g. a mask table) MT to support a patterning device (e.g. a mask) MA;
 two substrate tables (e.g. a wafer table) WT1, WT2, each for holding a substrate (e.g. a resist coated wafer) W1, W2 respectively; and
 a projection system (e.g. a refractive projection lens) PL configured to image a pattern imparted to the radiation beam PB by patterning device MA onto a target portion C (e.g. comprising one or more dies) of a substrate W held by one of the two substrate tables WT1, WT2.

The frame MF is a vibration isolated frame that is substantially isolated from external influences such as vibrations. For example, the frame MF may be supported by a base frame (not shown) on the ground via acoustically damping mounts (not shown), so as to isolate the frame MF from vibrations of the base frame. These acoustically damping mounts may be actively controlled to isolate vibrations which are introduced by the base frame and/or by the isolated frame MF itself.

In the dual stage lithographic apparatus depicted in FIG. 1A an alignment system AS and a topography measurement system TMS are provided on the left-hand side and the projection system PL is provided on the right-hand side. The projection system PL, alignment system AS and topography measurement system TMS are connected to the isolated frame MF.

The support structure MT is movably mounted to the frame MF via a first positioning device PM. The first positioning device PM may be used to move the patterning device MA, and to accurately position it, relative to the frame MF (and the projection system PL which is connected to the frame MF).

The substrate tables WT1, WT2 are movably mounted to the frame MF via first and second substrate positioning devices PW1, PW2 respectively. The first and second substrate positioning devices PW1, PW2 may be used to move substrates W1, W2 held by substrate tables WT1, WT2 respectively, and to accurately position the substrates W1, W2, relative to the frame MF (and the projection system PL, alignment system AS and topography measurement system TMS which are connected to the frame MF). The support structure MT and the substrate tables WT1, WT2 may be referred to collectively as object tables. The first and second substrate positioning devices PW1, PW2 may each be considered to be a scanning mechanism operable to move a substrate table WT1, WT2 along a scanning path relative to the radiation beam such that the radiation beam scans across a target portion C of the substrate W.

The lithographic apparatus shown in FIG. 1A is therefore of a type having two substrate tables WT1, WT2, which may be referred to as a dual stage apparatus. In such "multiple stage" machines the two substrate tables WT1, WT2 are used in parallel, with preparatory steps being carried out on one of the substrates tables while the other substrate table is being used for exposure. The preparatory steps may include mapping the surface of the substrate using a level sensor LS and measuring the position of alignment marks on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

In FIG. 1A, the substrate table WT1 is disposed on the left and the substrate table WT2 is disposed on the right. In this configuration, substrate table WT1 can be used to carry out various preparatory steps in relation to the substrate W1 held thereby using alignment system AS (as will be described more fully below) and topography measurement system TMS prior to exposure of that substrate W1. Simultaneously, the substrate table WT2 can be used for exposure of another substrate W2 held by substrate table WT2. Once the substrate W2 held by substrate table WT2 has been exposed and the preparatory steps in relation to the substrate W1 held by substrate table WT1 have been carried out, the two substrate tables WT1, WT2 swap places. Subsequently, the substrate W1 held by substrate table WT1 is exposed to radiation and the substrate W2 held by substrate table WT2 that has previously been exposed to radiation is replaced with a new substrate and various preparatory steps are performed in relation to the new substrate.

Therefore each of the two substrate tables WT1, WT2 can be disposed either on the left or the right of FIG. 1A. Unless stated otherwise, in the following substrate table WT1 will generally refer to the substrate table with is at that time disposed on the left and substrate table WT2 will generally refer to the substrate table with is at that time disposed on the right.

FIG. 1B shows a plan view of a substrate W which may represent either of the two substrates W1, W2 of FIG. 1A. In the following, unless otherwise stated, substrates on the left and right of the lithographic apparatus will be referred to as substrate W. FIG. 1C shows a plan view of the patterning device MA, which is provided with patterning device alignment marks (schematically depicted as boxes M1, M2).

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The illuminator IL may be referred to as a radiation system. Alternatively, the source SO and the illuminator IL, together with the beam delivery system BD if required, may be collectively referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may also be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjusting means AM for adjusting the intensity distribution of the beam. Generally, at least the outer and/or inner radial extent (commonly referred to as -outer and -inner, respectively) of the intensity distribution in a pupil plane of the illuminator can be adjusted. The illuminator IL may also be operable to vary the angular distribution of the beam in a pupil plane of the illuminator. For example, the illuminator IL may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution, as is known in the art. A desired illumination mode may be obtained by inserting an optic which provides that illumination mode into the illuminator IL.

The illuminator IL may be operable alter the polarization of the beam and may be operable to adjust the polarization using adjusting means AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator IL may be arranged to linearly polarize the radiation beam. The polarization direction of the radiation beam may vary across a pupil plane of the illuminator IL, i.e. the polarization direction of radiation may be different in different regions in the pupil plane of the illuminator IL. The polarization state of the radiation may be chosen in dependence on the illumination mode.

In addition, the illuminator IL generally comprises various other components, such as an integrator IN and a condenser CO. The illuminator IL provides a conditioned beam of radiation PB, having a desired uniformity and intensity distribution in its cross section.

The shape and (spatial) intensity distribution of the conditioned beam of radiation PB are defined by optics of the illuminator IL. In a scan mode, the conditioned radiation beam PB may be such that it forms a generally rectangular band of radiation on the patterning device MA. The band of radiation may be referred to as an exposure slit (or slit). The slit may have a longer dimension (which may be referred to as its length) and a shorter dimension (which may be referred to as its width). The width of the slit may correspond to a scanning direction (y direction in FIG. 1) and the length of the slit may correspond to a non-scanning direction (x direction in FIG. 1). In a scan mode, the length of the slit limits the extent in the non-scanning direction of the target portion C that can be exposed in a single dynamic exposure. In contrast, the extent in the scanning direction of the target portion C that can be exposed in a single dynamic exposure is determined by the length of the scanning motion.

The terms "slit", "exposure slit" or "band or radiation" may be used interchangeably to refer to the band of radiation that is produced by the illuminator IL in a plane perpendicular to an optical axis of the lithographic apparatus. This plane may be at, or close to, either the patterning device MA or the substrate W. The terms "slit profile", "profile of the radiation beam", "intensity profile" and "profile" may be used interchangeably to refer to the shape of the (spatial) intensity distribution of the slit, especially in the scanning direction.

The illuminator IL comprises two masking blades (shown schematically in FIG. 1A as B). Each of the two masking blades is generally parallel to the length of the slit, the two masking blades being disposed on opposite sides of the slit. Each masking blade is independently movable between a retracted position wherein it is not disposed in the path of the radiation beam PB and an inserted position wherein it blocks the radiation beam PB. The masking blades are disposed in a plane of the illuminator IL which is conjugate to that of the patterning device MA (and the substrate W). Such a plane may be referred to as a field plane. Therefore, by moving the masking blades into the path of the radiation beam, the profile of the radiation beam PB can be sharply truncated thus limiting the extent of the field of radiation beam PB in the scanning direction. The masking blades can be used to control which parts of an exposure region receive radiation.

The patterning device MA is also disposed in a field plane of the lithographic apparatus. In one embodiment, the masking blades may be disposed adjacent to the patterning device MA such that both the masking blades and the patterning device MA lie in substantially the same plane. Alternatively, the masking blades may be separated from the patterning device MA such that they each lie in a different field plane of the lithographic apparatus and suitable focusing optics (not shown) may be provided between the masking blades and the patterning device MA.

The illuminator IL comprises an intensity adjustor IA (shown schematically in FIG. 1A). The intensity adjustor IA is operable to attenuate the radiation beam on opposing sides of the radiation beam, as now described. The intensity adjustor IA comprises a plurality of movable fingers arranged in pairs, each pair comprising one finger on each side of the slit (i.e. each pair of fingers is separated in the y-direction). The pairs of fingers are arranged along the length of the slit (i.e. extending in the x-direction). Each movable finger is independently movable in the scanning direction (y-direction). That is, the fingers are moveable in a direction perpendicular to the length of the slit. In use, each movable finger is independently movable in the scanning direction. For example, each movable finger may be movable between at least a retracted position wherein it is not disposed in the path of the radiation beam and an inserted position wherein it partially blocks the radiation beam. By moving the fingers, the shape and/or the intensity distribution of the slit can be adjusted.

The field may be in the penumbra of the fingers such that the fingers do not sharply cut off the radiation beam PB. The pairs of fingers may be used to apply a different level of attenuation of the radiation beam PB along the length of the slit.

The fingers may, for example, be used to ensure that the integral of the intensity profile of the radiation beam PB across the width of the slit is substantially constant along the length of the slit.

The radiation beam PB exiting the illuminator IL is incident on the patterning device (e.g. mask) MA, which is held on the support structure MT. Having traversed the patterning device MA, the beam PB passes through the projection system PL, which focuses the beam onto a target portion C of the substrate W. With the aid of the second substrate positioning device PW2 and position sensor IF (e.g. an interferometric device), the substrate table WT2 can be moved accurately relative to the frame MF, e.g. so as to position different target portions C in the path of the beam PB. Similarly, the first positioning device PM and another position sensor (which is not explicitly depicted in FIG. 1A) can be used to accurately position the patterning device MA with respect to the frame MF, e.g. after mechanical retrieval from a mask library, or during a scan. In general, movement of the object tables MT and WT1, WT2 will be realized with the aid of a long-stroke module (coarse positioning) and a short-stroke module (fine positioning), which form part of the positioning devices PM, PW1 and PW2. Patterning device MA and substrate W may be aligned using patterning device alignment marks M1, M2 and substrate alignment marks P1, P2.

The projection system PL may apply a reduction factor to the radiation beam PB, forming an image with features that are smaller than corresponding features on the patterning device MA. For example, a reduction factor of 4 may be applied.

In the scan mode, the first positioning device PM is operable to move the support structure MT, relative to the beam of radiation PB that has been conditioned by the illuminator IL, along a scanning path. In an embodiment, the support structure MT is moved linearly in a scanning direction at a constant scan velocity $v_{MT}$. As described above, the slit is orientated such that its width extends in the scanning direction (which coincides with the y-direction of FIG. 1). At any instance each point on the patterning device MA that is illuminated by the slit will be imaged by the projection system PL onto a single conjugate point in the plane of the substrate W. As the support structure MT moves in the scanning direction, the pattern on the patterning device MA moves across the width of the slit with the same velocity as the support structure MT. In particular, each point on the patterning device MA moves across the width of the slit in the scanning direction at velocity $v_{MT}$. As a result of the motion of this support structure MT, the conjugate point in the plane of the substrate W corresponding to each point on the patterning device MA will move relative to the slit in the plane of the substrate table WT2.

In order to form an image of the patterning device MA on the substrate W, the substrate table WT2 is moved such that the conjugate point in the plane of the substrate W of each point on the patterning device MA remains stationary with respect to the substrate W. The velocity (both magnitude and direction) of the substrate table WT2 relative to the projection system PL is determined by the demagnification and image reversal characteristics of the projection system PL (in the scanning direction). In particular, if the characteristics of the projection system PL are such that the image of the patterning device MA that is formed in the plane of the substrate W is inverted in the scanning direction then the substrate table WT2 should be moved in the opposite direction to the support structure MT. That is, the motion of the substrate table WT2 should be anti-parallel to the motion of the support structure MT. Further, if the projection system PL applies a reduction factor a to the radiation beam PB then the distance travelled by each conjugate point in a given time period will be less than that travelled by the corresponding point on the patterning device by a factor of a. Therefore the magnitude of the velocity $|v_{WT}|$ of the substrate table WT2 should be $|v_{MT}|/a$.

During exposure of a target portion C, the masking blades of the illuminator IL can be used to control the width of the slit of radiation beam PB, which in turn limits the extent of the exposure regions in the planes of the patterning device MA and the substrate W respectively. That is the masking blades of the illuminator serve as a field stop for the lithographic apparatus.

Using the scan mode, the lithographic apparatus is operable to expose a target portion C of the substrate W with substantially fixed area to radiation. For example, the target portion C may comprise part of, one or several dies. A single wafer may be exposed to radiation in a plurality of steps, each step involving the exposure of a target portion C followed by a movement of the substrate W. After exposure of a first target portion C, the lithographic apparatus may be operable to move the substrate W relative to the projection system PL so that another target portion C can be exposed to radiation. For example, between exposures of two different target portions C on the substrate W, the substrate table WT2 may be operable to move the substrate W so as to position the next target portion so that it is ready to be scanned through the exposure region.

Alternatively, the depicted apparatus can be used in another mode, wherein the support structure MT is kept essentially stationary holding a programmable patterning device, and the substrate table WT2 is moved or scanned while a pattern imparted to the beam PB is projected onto a target portion C. In this mode, generally a pulsed radiation source is employed and the programmable patterning device is updated as required after each movement of the substrate table WT2 or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As described further below, the alignment system AS measures the positions of alignment marks provided on the substrate W (schematically depicted by boxes P1, P2 in FIG. 1B) which is held on left-hand substrate table WT1. In addition, the topography measurement system TMS is used to measure the topography of a surface of the substrate W held on left-hand substrate table WT1. The first substrate positioning device PW1 and a position sensor (which is not explicitly depicted in FIG. 1A) can be used to accurately position the substrate table WT1 relative to the frame MF (and the alignment system AS and the topography measurement system TMS connected thereto).

The topography measurement system TMS may be operable to output a signal $s_1$ that is indicative of the height of the substrate W1. The alignment system AS may be operable to output a signal $s_2$ that is indicative of the position of one or more alignment marks on the substrate W1 or the substrate table WT1. The output signals $s_1$, $s_2$ are received by a processor PR.

The signal $s_1$ output by the topography measurement system TMS may be analyzed by processor PR to determine the height of the substrate W1. The processor PR may be used to generate a map of the topography of the substrate W1. The processor PR may comprise a memory and may be operable to store information relating to the topography of the entire substrate W1. The topography of the surface of a substrate W1 may be referred to as a height map. During exposure of a substrate W (on the right-hand side of FIG. 1A) it is desirable to keep the substrate W in a focal plane of the projection system PL. In order to achieve this, the substrate table WT2 may be moved in the z direction, said movement of the substrate table WT2 being determined in dependence on the topography of the surface of a substrate W (as previously determined by the topography measurement system TMS).

The signal $s_2$ output by the alignment system AS may be analyzed by processor PR to determine the positions of one or more alignment marks on the substrate W1 and the substrate table WT1. The first substrate positioning device PW1 may be operable to move the substrate table WT1 so as to position each alignment mark below the alignment system AS in turn while a position sensor IF (either position sensor IF or another position sensor dedicated to the measurement station) measures the substrate table WT1. As an initial step, the first substrate positioning device PW1 may be used to position one or more alignment marks on the substrate table WT1 below the alignment system AS and the position of each of the alignment marks is determined. Subsequently, the first substrate positioning device PW1 may be used to position one or more alignment marks on the substrate W1 below the alignment system AS and the position of each of the alignment marks is determined. For example, the position of the substrate table WT1 as determined by the position sensor may be recorded while each alignment mark is directly below the alignment sensor AS. Effectively, the measurement of the position of the alignment marks on the substrate table WT1 allows the position of the substrate table WT1 as determined by the position sensor (for example sensor IF) to be calibrated (relative to the frame MF to which the alignment system AS is connected). Measurement of the position of the alignment marks on the substrate W1 allows the position of the substrate W1 relative to the substrate table WT1 to be determined.

The processor PR may be considered to be a digital signal processing system. The processor PR may comprise, e.g., one or more microprocessors or one or more Field-Programmable Gate Arrays (FPGA), etc.

In addition to data from the alignment system AS and the topography measurement system TMS, the processor PR also receives substrate table WT1 position information (see signal $s_3$ in FIG. 1A) from first substrate positioning device PW1 and/or from a position sensor (for example sensor IF). Since the substrate is fixed to (typically via a clamp) the substrate table WT1, the information from the alignment system AS can be used to convert position information relating to the substrate table WT1 to position information relating to the substrate W.

The apparatus may comprise a lithographic apparatus control unit (not shown) which controls all of the movements and measurements of the various actuators and sensors described. The lithographic apparatus control unit may include signal processing and data processing capacity to implement desired calculations relevant to the operation of the apparatus. The processor PR may form part of the lithographic apparatus control unit. In practice, lithographic apparatus control unit may be realized as a system of many sub-units, each handling the real-time data acquisition, processing and control of a subsystem or component within the apparatus. For example, one processing subsystem may be dedicated to servo control of the first and second substrate positioning devices PW1, PW2. Separate units may even handle coarse and fine actuators, or different axes. Another unit might be dedicated to the readout of the position sensor IF (and, if used, another position sensor for the measurement station). Overall control of the apparatus may be controlled by a central processing unit, communicating with these sub-systems processing units, with operators and with other apparatuses involved in the lithographic manufacturing process.

Figure 2A:
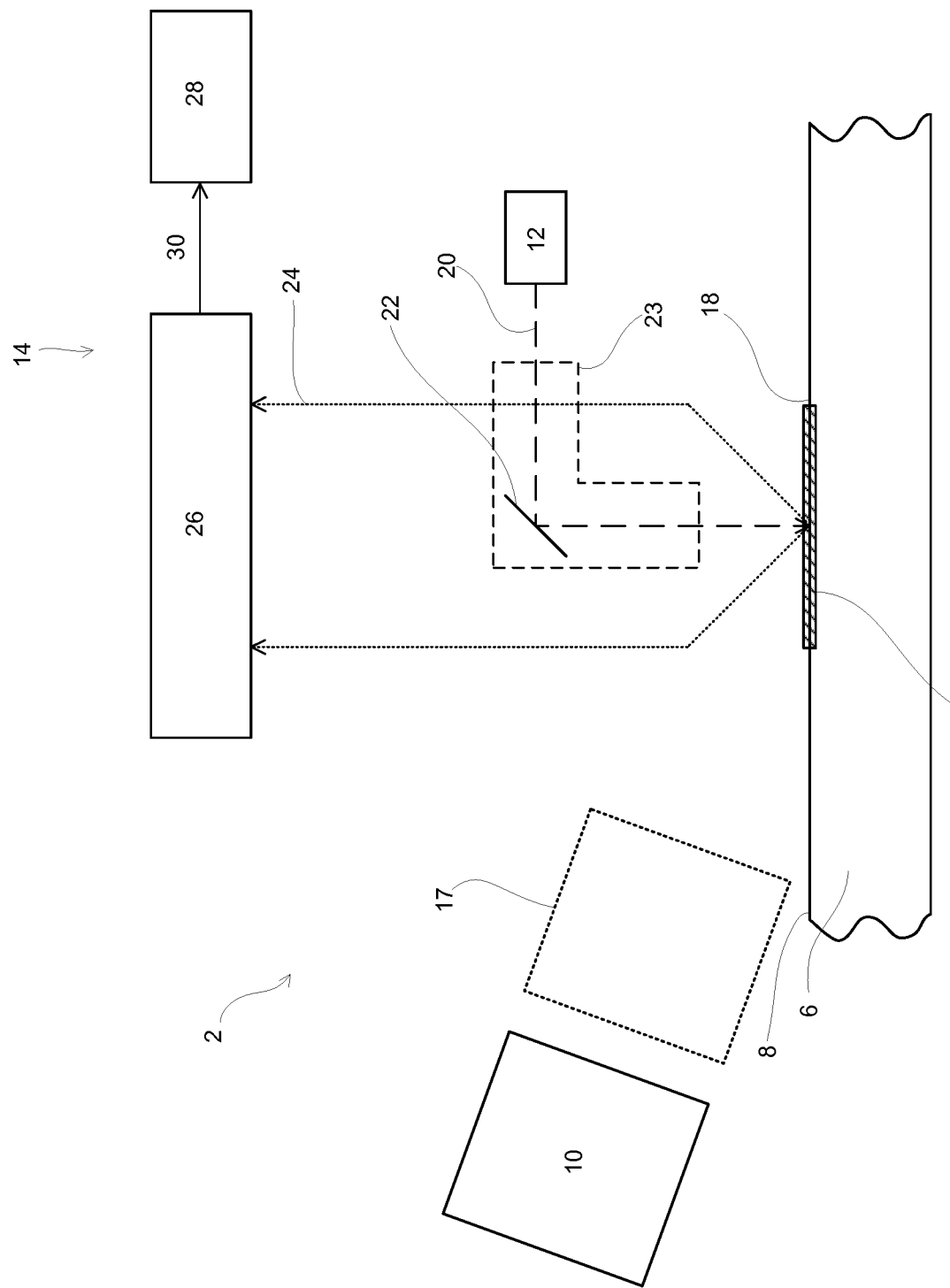
FIG. 2A is a schematic illustration of an apparatus according to an embodiment of the invention for determining a characteristic of a feature of an object, the feature being disposed below a top surface of the object.
Figure 2B:
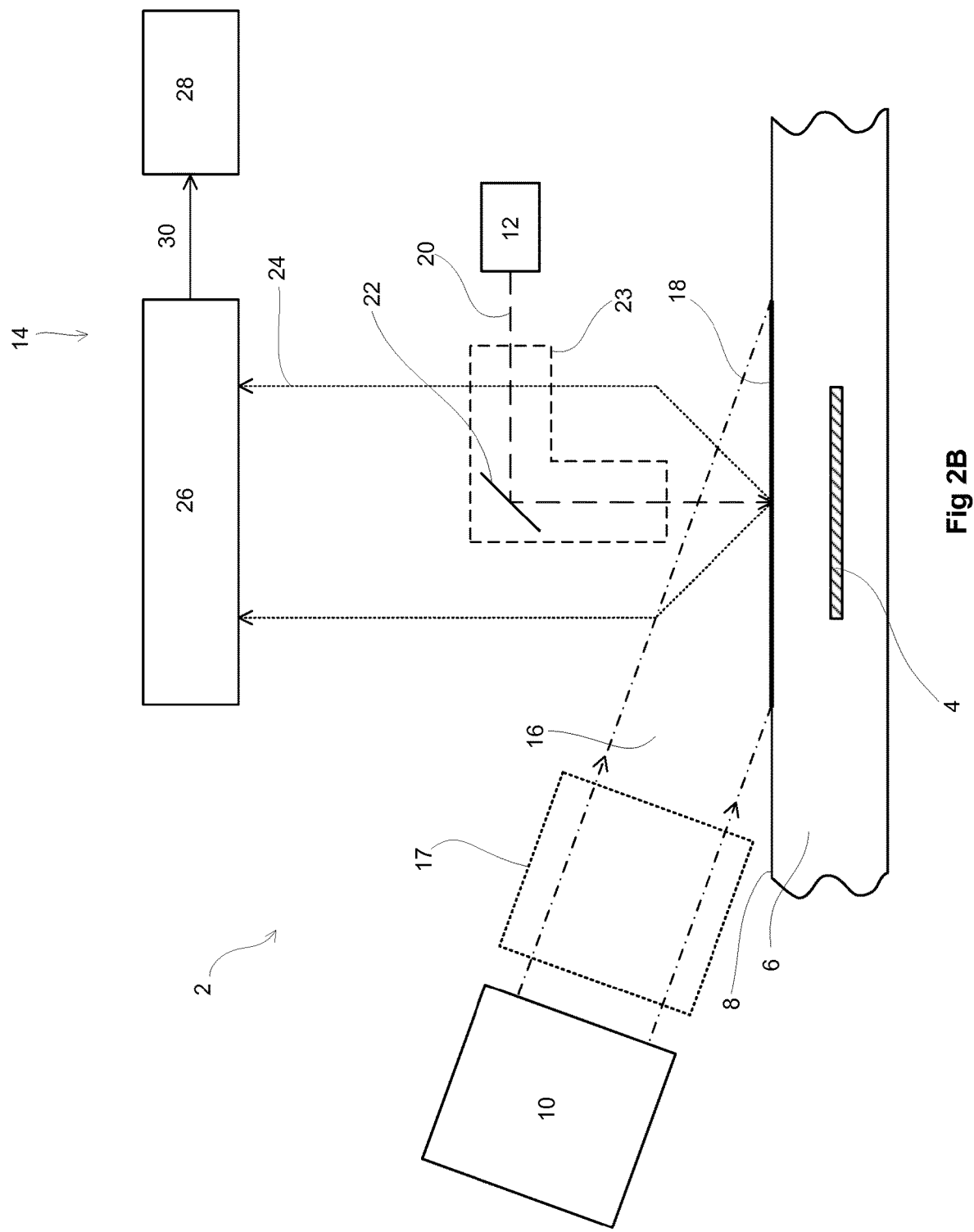
FIG. 2B is a schematic illustration of the apparatus for determining a characteristic of a feature of an object shown in FIG. 2A, the feature being disposed on the top surface of the object.

FIGS. 2A and 2B are schematic illustrations of an apparatus 2 for determining a characteristic of a feature 4 of an object 6.

The apparatus 2 comprises a pump radiation source 10, a measurement radiation source 12 and a measurement system 14. As will be described in further detail below, the pump radiation source 10 and the measurement radiation source 12 are both operable to produce radiation that a top surface 8 of the object 6 can be irradiated with. The pump radiation source 10 and the measurement radiation source 12 have different delivery systems such that the radiation from the pump radiation source 10 is delivered to the top surface 8 of the object 6 via a different optical path as compared to the radiation from the measurement radiation source 12.

The feature 4 may be disposed on or proximate to the top surface 8 of the object 6, as shown in FIG. 2A. Alternatively, the feature 4 may be disposed below a top surface 8 of the object 6, as shown in FIG. 2B.

The object 6 may, for example, be a silicon wafer (for example, as schematically shown as substrate W in FIG. 1B) and the feature 4 may be an alignment mark (for example, as schematically shown as substrate alignment marks P1, P2 in FIG. 1B). The alignment mark may be of the form of a reflective grating. Typically at least one or more layers of material may be provided over such an alignment mark. For example, a layer of resist, anti-reflection coatings and/or process layers generated during preceding steps in the manufacture of an integrated circuit may be disposed on top of (i.e. closer to the top surface 8 than) the alignment mark. In general, such alignment marks may be disposed between 1 μm and 10 μm from the top surface 8 of the object 6. As will be explained further below, as used herein, any reference to a feature 4 being disposed on or proximate to the top surface 8 may mean that the feature 4 is within a region of the object that measurement radiation 20 can penetrate into the object 6 from the top surface 8. Similarly, as used herein, any reference to a feature 4 being disposed below the top surface 8 may mean that the feature 4 is within a region of the object that measurement radiation 20 cannot penetrate into the object 6 from the top surface 8.

The measurement radiation source 12 is operable to produce measurement radiation 20. The top surface 8 of the object 6 can be irradiated with the measurement radiation 20. In the embodiment shown in FIGS. 2A and 2B, the measurement radiation 20 is of the form of a measurement radiation beam 20 and is projected into the top surface 8 via a reflective optical element 22 (for example a mirror).

The reflective optical element 22 may be considered to form at least a part of a measurement radiation delivery system 23 that is operable to irradiate at least a part of the top surface 8 of the object 6 with the measurement radiation 20. It will be appreciated that FIGS. 2A and 2B are schematic representations and that in practice the measurement radiation delivery system 23 may comprise additional optical components (reflective and/or refractive optics). It will be appreciated that the measurement radiation delivery system 23 may be considered to comprise all optical components disposed between the measurement radiation source 12 and the top surface 8 of the object 6.

It will be appreciated that any reference to the measurement radiation delivery system 23 being operable to irradiate at least a part of the top surface 8 of the object 6 with the measurement radiation 20 should be understood to mean that the measurement radiation delivery system 23 is operable to irradiate at least a part of a plane that, in use, is coincident with the top surface 8 of the object 6 with the measurement radiation 20. The plane that, in use, is coincident with the top surface 8 of the object 6 may be referred to as the object plane.

The measurement system 14 is operable to receive at least a portion 24 of the measurement radiation beam 20 scattered from the top surface 8. In this context, it will be appreciated that the at least a portion 24 of the measurement radiation beam 20 that is scattered from the top surface 8 may be scattered from a region of the body 6 proximate to the top surface 8 that the measurement radiation beam 20 can penetrate into the object 6 from the top surface 8. The measurement system 14 is further operable to determine a characteristic of the feature 4 of the object 6 from at least a portion 24 of the measurement radiation beam 20 scattered from the top surface 8. For example, the measurement system 14 may be operable to determine a position of the feature 4 (for example an alignment mark) in the object 6 from the portion 24 of the measurement radiation beam 20 scattered from the top surface 8 of the object 6.

The measurement system 14 comprises a sensor 26 and a processor 28. The sensor 26 is operable to detect the radiation 24 scattered from the top surface 8 and to output a signal 30 containing information related to a position of the feature 4. The processor 28 is configured to receive the signal 30 from the sensor 26 and to determine a position of the feature 4, for example relative to a substrate table, in dependence thereon.

The pump radiation source 10 is operable to produce pump radiation 16 (see FIG. 2B). At least a part of the top surface 8 of the object 6 can be irradiated with the pump radiation 16. In the embodiment shown in FIGS. 2A and 2B, the pump radiation 16 is of the form of a pump radiation beam 16 that is projected through the top surface 8 via a pump radiation delivery system 17. The pump radiation delivery system 17 is operable to irradiate at least a part of the top surface 8 of the object 6 with the pump radiation beam 16 so as to produce a mechanical response in the object 6. In the following description of an embodiment of the invention, the mechanical response in the object 6 is an acoustic wave. However, it will be appreciated that, in general, the mechanical response may be any physical effect that results from the absorption of the pump radiation beam 16 by the object 6, including any form of heating or thermal expansion of the object 6 caused by the absorption of the pump radiation beam 16. In general, the mechanical response may, for example, be a mechanical wave (either a travelling or standing wave). It will be appreciated that such mechanical waves may comprise acoustic waves or any other propagation of heat such as, for example, diffusion of free electrons. It will be appreciated that FIGS. 2A and 2B are schematic representations and that the pump radiation delivery system 17 may be considered to comprise all optical components (reflective and/or refractive optics) disposed between the pump radiation source 10 and the top surface 8 of the object 6.

In order to generate a mechanical response in the object 6, the pump radiation beam 16 may have an intensity that varies with time. For example, the pump radiation beam 16 may be a pulsed radiation beam. In the following description of an embodiment of the invention, the pump radiation beam 16 is a pulsed radiation beam. However, it will be appreciated that, in general, the pump radiation beam 16 may have an intensity that has any time modulation.

It will be appreciated that any reference to the pump radiation delivery system 17 being operable to irradiate the top surface 8 of the object 6 with the pump radiation 16 should be understood to mean that the pump radiation delivery system 17 is operable to irradiate at least a part of the object plane, which, in use, is coincident with the top surface 8 of the object 6 with the pump radiation 16.

In use, when the pump radiation 16 is being used, the pulsed pump radiation beam 16 is incident on a beam spot region 18 of the top surface 8 which is disposed above the feature 4. The pump radiation source 10 may be an ultrafast laser. It is known that such ultrafast lasers can generate acoustic waves inside a variety of different materials. In this process, the optical energy of the pulsed pump radiation beam 16 is converted into photoinduced stress in a region of the object 6. This region of the object 6 within which the acoustic waves are generated may be at, or proximate to, the top surface 8. It will be appreciated that the region within which the acoustic waves are generated will be a region that the pulsed pump radiation beam 16 can penetrate to from the top surface 8. For example, it may be an opaque layer that is disposed beneath the top surface 8. That is, the region within which the acoustic wave is generated may be a layer that is not the top most material in the object 6 (i.e. not the layer closest to the top surface 8). For example, there may be a layer of resist on top of (i.e. closer to the top surface 8 than) the layer within which the acoustic wave is generated. Additionally or alternatively, there may be one or more layers of material above (i.e. closer to the top surface 8 than) the layer within which the acoustic wave is generated such as, for example anti-reflection coatings. The depth of the region within which the acoustic waves are generated is known as the characteristic depth and is dependent both on material properties of the object 6 and characteristics of the pulsed pump radiation beam 16. This process can produce a coherent acoustic wave within the object 6. The acoustic wave may propagate away from the region within which it is generated and, in particular, may propagate away from the top surface 8 and through one or more layers of opaque material. Additionally or alternatively, the acoustic wave may be a standing wave.

It will be appreciated by the skilled person that in this context the term ultrafast laser means a laser that outputs pulses with a relatively small temporal duration. The term ultrafast laser may include lasers which are operable to output pulses with a temporal duration of the order of nanoseconds, picoseconds, femtoseconds or less. The ultrafast laser may, for example, be operable to output pulses with a temporal duration of the order of tens of picoseconds or less. Such ultrafast lasers are typically mode-locked lasers.

For sufficiently short pulses of the pump radiation beam 16, the width, or temporal extent, of the acoustic pulses generated is mostly determined by how fast the lattice (in the layer or layers of material within the characteristic depth from the top surface 8) can react to the pump pulse heating the electrons (i.e. electron-phonon coupling) and how far the electrons can travel in the medium of the layer(s). Typically, the temporal extent of the acoustic pulses is of the order of 10 ps. In turn, the frequency of the acoustic wave generated is approximately equal to the inverse of the temporal duration of the pulses of the acoustic wave. For acoustic pulses with a temporal extent of the order of 10 ps, the frequency will be of the order of 100 GHz. The optimum duration for a single pulse of the pulsed pump radiation beam 16 may be approximately inversely proportional to the highest acoustic frequency that can be used in a specific material. The highest acoustic frequency that can be used in a typical materials may be of the order of 100 GHz, which results in an optimum duration for a single pulse of the pulsed pump radiation beam 16 of the order of 10 ps. Shorter pulses at similar energy are more likely to lead to damage to the object 6.

The acoustic waves propagate at a speed of sound that is dependent on the material through which they propagate. The typical speed of sound in metals is several thousand m/s. For example, the speed of sound in gold is of the order of 6000 m/s. The wavelength of the acoustic waves in a given material is given by the ratio of the speed of sound in that material to the frequency of the acoustic waves (which, as explained above, is mainly dependent on properties of the material(s) close to the top surface 8 of the object 6). For a speed of sound in the range 1000 to 10,000 m/s and a frequency of the order of 100 GHz, the wavelength of the acoustic waves will be of the order of 10 to 100 nm. For acoustic pulses with a temporal extent of the order of 100 ps, the frequency will be of the order of 10 GHz. For a speed of sound in the range 1000 to 10,000 m/s and a frequency of the order of 10 GHz, the wavelength of the acoustic waves will be of the order of 100 to 1000 nm.

It will be appreciated that any discussion of specific values or ranges for any of the following quantities contained herein is by way of example only: the temporal duration of pulses of the pulsed pump radiation beam 16, the frequency of the acoustic wave generated, the speed of sound in the object and the wavelength of the acoustic waves. It will be appreciated that embodiments of the present invention can have values of these quantities which differ from those discussed above.

The apparatus 2 can be used to determine a characteristic of the feature 4 of an object 6 (for example a position of the feature 4) in two different operational modes, as now discussed.

As shown schematically in FIG. 2A, the apparatus 2 may be operable to determine the characteristic of the feature 4 using the measurement radiation 24 that has directly scattered from the feature 4. This may be referred to as a first operational mode. The first operational mode may be used, for example, when the feature 4 is disposed on or proximate to the top surface 8. In this context, it will be appreciated that the feature 4 being disposed on or proximate to the top surface 8 may mean that the feature 4 is within a region of the object that the measurement radiation 20 can penetrate into from the top surface 8.

Additionally or alternatively, as shown schematically in FIG. 2B, the apparatus 2 may be operable to determine the characteristic of the feature 4 using both the pump radiation 16 and the measurement radiation 20 as a pump-probe arrangement. First the pump radiation 16 is used to produce an acoustic wave in the object 6. The acoustic wave generated by the pump radiation 16 may propagate through the object 6 and a portion of it may be scattered by the feature 4 and propagate back to the top surface 8. Subsequently, the measurement radiation 20 is used to probe the top surface 8 of the object 6 so as to indirectly determine one or more characteristics of the feature 4. This may be referred to as a second operational mode. The second operational mode may be used, for example, when the feature 4 is disposed below the top surface 8 and, in particular, when an opaque material (for example an opaque layer formed from metal) is disposed between the top surface 8 and the feature 4.

When operating in the second operational mode, the apparatus 2 can therefore be used to implement methods that may be referred to as pump-probe methods. The pump radiation delivery system 17 is operable to irradiate at least a part of the top surface 8 of the object 6 with the pulsed pump radiation beam 16 so as to produce an acoustic wave in the object 6. The measurement radiation delivery system 23 is operable to irradiate at least a part of the top surface 8 of the object 6 with the measurement radiation beam 20, which can be used to detect or probe these optically generated acoustic waves. It is known that acoustic waves give rise to two effects that are observable with optical methods: (1) the propagating strain causes a displacement of the metal lattice; and (2) the stress related to the acoustic waves induces changes of the dielectric constant via photo-elastic effects.

It will be appreciated that the determination of the characteristic of the feature 4 of the object 6 from at least a portion 24 of the measurement radiation beam 20 scattered from the top surface 8 by the measurement system 14 may be different in the first and second operational modes.

In one embodiment, the pulsed pump radiation beam 16 may comprise pulses with a temporal extent of around 50 fs. In another embodiment, the pulsed pump radiation beam 16 may comprise pulses with a temporal extent of approximately 1 ps. The pulsed pump radiation beam 16 may have any suitable wavelength as desired. The wavelength of the pulsed pump radiation beam 16 may be chosen so as to reduce the exposure of photoresists on the substrate W. In some embodiments, the pulsed pump radiation beam 16 may have a wavelength of around 400 nm. In some embodiments, the pulsed pump radiation beam 16 may have a wavelength of greater than 400 nm so as to further reduce the exposure of photoresists on the substrate W. In some embodiments, the pulsed pump radiation beam 16 may have a wavelength in the range 400 to 800 nm At least when the apparatus is operating in the second operational mode, the measurement radiation beam 20 may comprise pulses with a temporal extent which is of the same order of magnitude as the temporal extent the pulses of the pulsed pump radiation beam 16. The measurement radiation beam 20 may have any suitable wavelength as desired. The wavelength of the measurement radiation beam 20 may be chosen so as to reduce the exposure of photoresists on the substrate W. In some embodiments the measurement radiation beam 20 may have a wavelength in the range 400 to 800 nm. For example, in some embodiments the measurement radiation beam 20 may have a wavelength of the order of 500 nm The acoustic wave generated by the pulsed pump radiation beam 16 may propagate through the object 6 and a portion of it may be reflected by the feature 4 and propagate back to the top surface 8. The second operation mode of the apparatus 2 has particular application to objects that comprise an opaque material (for example having an opaque layer formed from metal) through which electromagnetic radiation cannot propagate. The acoustic waves allow the feature 4 to be probed through such opaque layers. It has been found that for a feature 4 comprising a reflective diffraction grating disposed beneath a metal layer with a thickness of around 100 nm (i.e. with the metal layer being disposed between the top surface 8 and the feature 4) acoustic signals formed on the top surface 8 may be strong enough to achieve position measurement with an accuracy of less than 1 nm in a time of around 0.1 s.

The apparatus 2 may have particular application to objects that comprise a plurality of layers of materials, for example a substrate W on which a plurality of layers of an integrated circuit have been formed.

When an acoustic wave has been generated in an object 6, in general, every interface between two layers of material with different accoustic properties will produce an acoustic reflection. That is, a portion of an accoustic wave incident on any such interface will be reflected (and another portion will be transmitted). The amplitude of the reflected portion and phase shift of the reflected portion (relative the incident wave) depends on the material properties of the respective layers. For a silicon wafer comprising multiple layers, each interface between adjacent layers gives rise to an acoustic reflection. A signal formed at the top surface 8 of the object 6 may be a superposition of many such reflections, leading to a potentially complex acoustic echo formed at the top surface 8 of the object 6.

The apparatus 2 provides an arrangement that can be operated in either one of the first and second operational modes. This arrangement therefore optionally provides the functionality of the second operational mode in addition to the first operational mode, which is typically provided by prior art position detectors or alignment sensors.

Furthermore, the apparatus 2 comprises both a measurement radiation delivery system 23 and a pump radiation delivery system 17. Therefore, the apparatus 2 comprises two different radiation delivery systems (the measurement radiation delivery system 23 and the pump radiation delivery system 17). Such an arrangement is advantageous over an arrangement wherein pump radiation 16 and measurement radiation 20 share a common delivery system for a number of reasons, as now discussed.

Operation in the second operational mode is advantageous since it allows measurement of a characteristic of a feature 4 even when an opaque material is disposed between the top surface 8 and the feature 4. However, when the feature 4 is disposed on or proximate to the top surface 8 better accuracy may be achieved by using the first operational mode. Therefore, it may be desirable to be able to switch between the first and second operational modes. When operating in the first operational mode the pump radiation source 10 is switched off and when operating in the second operational mode the pump radiation source 10 is switched on.

In order to generate acoustic waves in the object 6, the intensity of the pump radiation source 10 is typically high. In turn, the typical intensity of the pump radiation 10 (typically comprising a series of laser pulses) that is required to induce the acoustic waves can cause significant heating. Therefore, when operating in the second operational mode, the pump radiation 16 may cause significant thermal expansion of the delivery system used by the pump radiation 16. However, when operating in the first operational mode, such heating and resultant thermal expansion of the delivery system used by the pump radiation 16 is absent. If the pump radiation 16 and the measurement radiation 20 share a common delivery system then there would be a significant difference in the delivery system when operating in the first and second operational modes due to the different levels of thermal expansion. In turn, this affects the measurement radiation 20 (which shares the common delivery system) and the determined characteristic of the feature 4 derived from the scattered measurement radiation 24. The apparatus 2 shown in FIGS. 2A and 2B avoids this problem.

In addition, by providing the pump radiation 16 via a separate pump radiation delivery system 17, the apparatus 2 provides an arrangement that allows a pump radiation source 10 and pump radiation delivery system 17 to be retrofitted to existing alignment sensors in an easy way. This can allow existing alignment systems to be upgraded so as to provide the additional functionality of the second operational mode whilst minimizing cost and effort.

Providing the pump radiation 16 and measurement radiation 20 via separate delivery systems (pump radiation delivery system 17 and measurement radiation delivery system 23) also allows the optics of each of the two delivery systems to be better optimized for the radiation that they deliver. For example, it may allow the pump radiation 16 and measurement radiation 20 to have different wavelengths whilst allowing wavelength dependent parameters of optical elements in each of the delivery systems (for example multilayer coatings, focal lengths and so on) to be compatible with a different one of these wavelengths. Furthermore, it will be appreciated that in general it may be desirable that the size of the beam spot for the two different radiation beams be different. In addition, it may be undesirable for any pump radiation 16 scattered from the top surface 8 of the object 6 to be received by the measurement system 14.

It will be appreciated that the apparatus 2 comprising both a measurement radiation delivery system 23 and a pump radiation delivery system 17 is intended to mean that the apparatus 2 comprises two different radiation delivery systems (the measurement radiation delivery system 23 and the pump radiation delivery system 17). It will be further appreciated that by this is meant that at least part of the measurement radiation delivery system 23 is separate or distinct from at least part of the pump radiation delivery system 17. However, it will be appreciated that the measurement radiation delivery system 23 and the pump radiation delivery system 17 may share one or more common elements. It particular, it is intended that an apparatus 2 comprising both a measurement radiation delivery system 23 and a pump radiation delivery system 17 means that at least a part of the measurement radiation delivery system 23 that is closest to the object 6 is separate or distinct from at least part of the pump radiation delivery system 17 that is closest to the object 6.

As can be seen from FIGS. 2A and 2B, the measurement radiation delivery system 23 and the pump radiation delivery system 17 are configured such that an angle of incidence of the pump radiation 16 at an object plane (coincident with the top surface 8 of the object 6 in FIG. 2B) is different from an angle of incidence of the measurement radiation 20 at the object plane. Furthermore, the pump radiation delivery system 17 is configured such that the pump radiation 16 is incident on the object plane at a non-zero angle of incidence.

Typically in pump-probe arrangements both the pump radiation and the probe radiation are normally incident on the object (i.e. incident with a zero angle of incidence). Furthermore, in the context of a position measurement system (for example an alignment sensor for use in a lithography system), the skilled person would recognize that it is important that the acoustic waves generated in the object 6 propagate generally perpendicularly to the top surface 8 of the object 6 (both away from the top surface to the feature and back to the top surface). This can allow the shape of the feature 4 (for example a reflective diffraction grating), or at least for a distorted copy of the feature 4, to be reproduced at substantially the same position (in a plane parallel to the top surface 8) on the top surface 8. If the acoustic waves generated in the object 6 propagate in a direction that is not normal to the top surface 8 of the object 6 then any signal produced on the top surface 8 which is probed using the measurement beam 20 may be shifted in a plane parallel to the top surface 8 relative to the feature 4. Such an effect would contribute to an error of the position measurement. The skilled person would not consider illuminating the top surface 8 of the object 6 with pump radiation at a non-zero angle of incidence since the skilled person may expect this to produce acoustic waves that do not propagate perpendicularly to the top surface 8.

However, contrary to this prejudice, the inventors of the present invention have realized that even if the pump radiation 16 is incident at a non-zero angle of incidence at the top surface 8 of the object 6 the generated acoustic waves that are excited in the object 6 will still travel perpendicularly to the top surface 8 of the object 6. This is because the speed of sound in the object 6 (of the order of several thousand m/s) is 5 orders of magnitude smaller than the speed of light.

Having the pump radiation delivery system 17 configured such that the pump radiation 16 is incident on the object plane at a non-zero angle of incidence allows the measurement radiation delivery system 23 to be configured such that the measurement radiation 20 is normally incident on the object 6 (i.e. incident with a zero angle of incidence). This may be advantageous in order to ensure that certain diffraction orders interfere with each other and/or so that the measurement system 14 works for features or alignment marks with a range of different pitches.

In one embodiment, the pump radiation delivery system 17 comprises an optical fiber.

Figure 3:
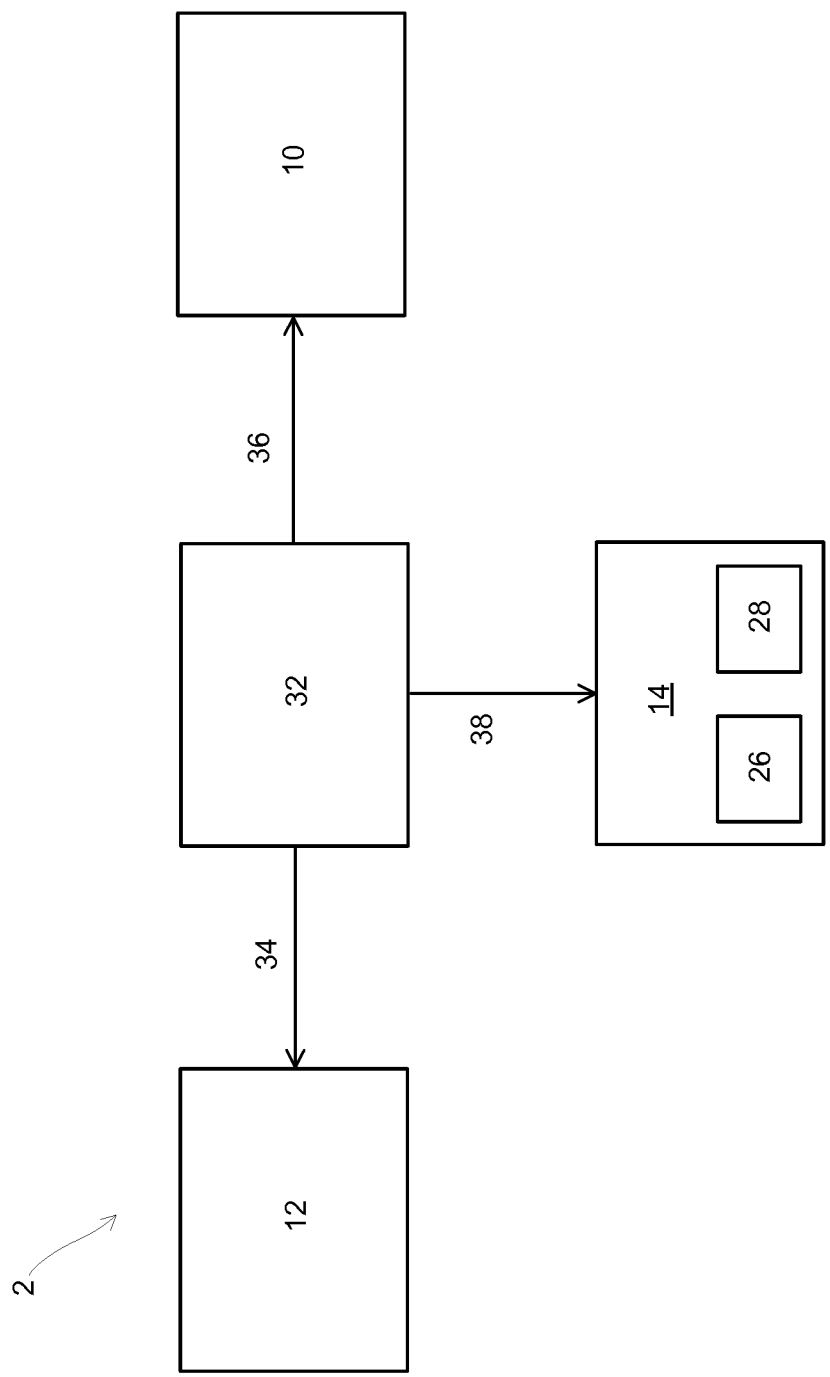
FIG. 3 is a schematic illustration of how a controller of the apparatus shown in FIGS. 2A and 2B is operable to control elements of the apparatus via control signals.

The operation of the apparatus 2 shown in FIGS. 2A and 2B is now described further with reference to FIG. 3. As shown in FIG. 3, the apparatus 2 further comprises a controller 32. The controller 32 is operable to control components of the apparatus 2 in order to switch between operation in the first operational mode and the second operational mode (i.e. the pump-probe method described above).

The controller 32 is operable to control the measurement radiation source 12 and the pump radiation source 10 via control signals 34, 36 respectively. The controller 32 is operable to operate in either a first operational mode or a second operational mode. When the controller 32 is operating in the first operational mode, the pump radiation source 10 does not produce the pump radiation 16. When the controller is operating in the second operational mode, the pump radiation source 10 produces pump radiation 16 at least part of the time. It will be appreciated that in this context, when the controller 32 is operating in the second operational mode, the pump radiation source 10 may be producing pump radiation 16 intermittently (for example as a pulsed laser beam).

The controller 32 may be operable to control one or more characteristics or parameters of the measurement radiation. For example, the measurement radiation source 12 may be operable to produce at least either first measurement radiation or second measurement radiation. The controller 32 may be operable to control the measurement radiation source 12 (for example via control signal 34) to produce the first measurement radiation when operating in the first operational mode and to control the measurement radiation source to produce the second measurement radiation when operating in the second operational mode.

As explained above, typically the pump radiation source 10 comprises an ultrafast laser, which can generate acoustic waves inside a variety of different materials. When the apparatus 2 is operating in the second operational mode the measurement radiation 20 may comprise pulses with substantially the same temporal duration as the pump radiation 16. This may be the second measurement radiation. Optionally, when the apparatus 2 is operating in the first operational mode the measurement radiation 20 may comprise pulses with a different temporal duration to the pulses of the pump radiation 16. This may be the first measurement radiation.

In some embodiments, an angular distribution of measurement radiation 24 from which the measurement radiation system 14 determines the characteristic of the feature 4 of the object 6 may be controllable.

Figure 4:
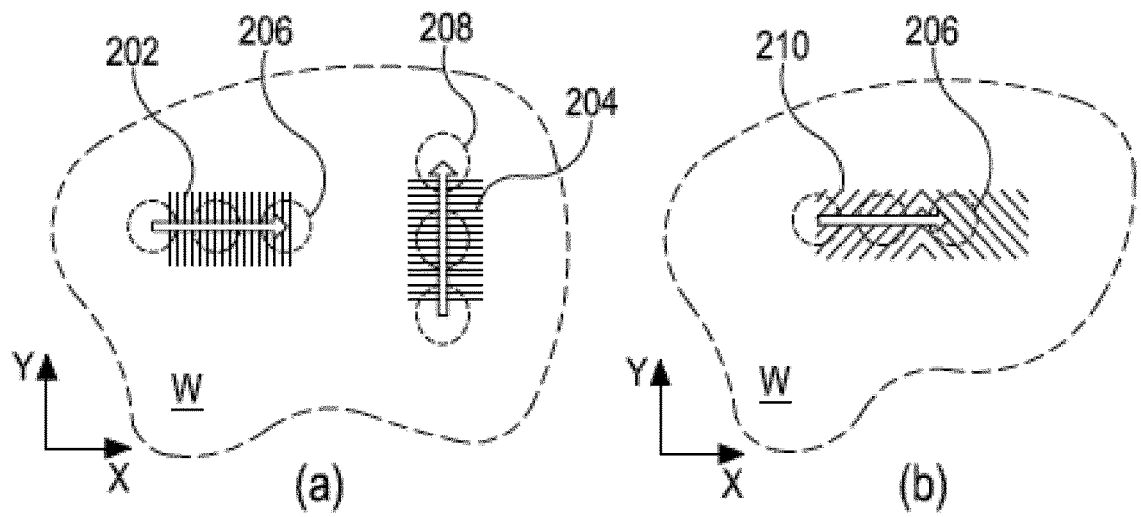
FIG. 4, comprising FIG. 4(a) and FIG. 4(b), schematically depicts various forms of an alignment mark that may be provided on a substrate in the apparatus of FIG. 1A.

The feature 4 may be generally of the form of a reflective diffraction grating that is configured to scatter the measurement radiation 20 into a plurality of diffraction orders. As will be described further below, with reference to FIGS. 4 to 6, information about the characteristic of the feature 4 (for example the position of the feature 4) may be contained in the $\pm n^{th}$ diffraction orders, where $n=1,2,3 \ldots$. Any other radiation that is scattered from the object 6 may form a background to this signal which may affect the accuracy with which the characteristic can be determined. Such scattered radiation that may form a background to the signal may include any specular reflection (which may be considered to form a $0^{th}$ order diffraction beam) and/or diffuse reflection. It may therefore be desirable to provide a zero order stop arranged to block radiation that is scattered from the object 6 in a range of angles centered on the direction of a specular reflection beam (or, equivalently, a $0^{th}$ order diffraction beam). This may be referred to as a pupil filter. The zero order stop or pupil filter may be adjustable.

The controller 32 may be operable to control the angular distribution of measurement radiation 24 from which the measurement radiation system 14 determines the characteristic of the feature 4 of the object 6 via a control signal 38. The controller 32 may be operable such that the characteristic of the feature 4 of the object 6 is determined from a first angular distribution when the controller 32 is operating in the first operational mode and from a second angular distribution when the controller 32 is operating in the second operational mode.

When the controller 32 is operating in the second operational mode, the measurement radiation 20 is not probing the feature 4 directly but rather is probing a signal formed on the top surface 8 by the acoustic wave scattered from the feature 4. The signal (i.e. scattered radiation 24) received by the measurement radiation system 14 when the controller 32 is operating in the second operational mode may therefore be reduced relative to the signal (i.e. scattered radiation 24) received by the measurement radiation system 14 when the controller 32 is operating in the first operational mode. Therefore, it may be advantageous, for example, to increase the size of a zero order block when operating in the second operational mode so as to enhance a signal to background ratio of the measurement.

In some embodiments, a sensitivity of the sensor 26 of the measurement system 14 to noise is controllable. Typically, the sensor 26 may comprise an array of sensing elements. The sensor 26 may comprise control electronics that may comprise a feedback resistor. The sensitivity of the sensor 26 of the measurement system to noise may be dependent on the resistance of the feedback resistor. A variable resistor or a system of resistors and switches may be provided to allow the feedback resistance to be controlled.

The controller 32 may be operable to control the sensitivity of the sensor 26 of the measurement system 14 to noise such that the sensor 26 has a first sensitivity to noise when the controller 32 is operating in the first operational mode and the sensor 26 has a second sensitivity to noise when the controller 32 is operating in the second operational mode. As explained above, the signal (i.e. scattered radiation 24) received by the measurement radiation system 14 when the controller 32 is operating in the second operational mode may be reduced relative to the signal (i.e. scattered radiation 24) received by the measurement radiation system 14 when the controller 32 is operating in the first operational mode. Therefore, it may be advantageous, for example, to reduce the sensitivity of the sensor 26 of the measurement system 14 to noise when operating in the second operational mode so as to enhance a signal to background ratio of the measurement. This may be achieved by using a first feedback resistance when operating in the first operational mode and using a second feedback resistance when operating in the second operational mode, the value of the second feedback resistance being larger than the value of the first feedback resistance. When using the second (larger) feedback resistance, a bandwidth or speed of the sensor 26 may be reduced relative to operation when using the first (smaller) feedback resistance.

In the above-described apparatus and methods for probing a feature 4 within an object 6 using optically induced acoustic waves, any suitable wavelength of the pulsed pump radiation beam 16 may be used. The spectrum of acoustic wavelengths that are generated may depend on the wavelength of the pulsed pump radiation beam 16, for example if the penetration depth of the radiation varies significantly with wavelength. In turn, the spectrum of acoustic wavelengths generated may have an effect on an optimal temporal shape of the pump. However, such effects are thought to be higher order effects. Therefore it is not expected that the methods will be very sensitive to the choice of wavelength although there may be an optimum wavelength for a given material at the top surface 8 (which is typically where the acoustic waves are generated).

In objects 8 with a large number of repeating layers, specific acoustic resonance frequencies can be expected, corresponding to the standing acoustic waves that may be formed in such structures. Those frequencies may be important to consider (either to use or to avoid) when operating in the second operational mode. Acoustic resonances occur for single layers which have a large acoustic impedance mismatch with respect to adjacent layers in the object (for example the layers above and below). For example, acoustic resonance could be expected for a high density layer (for example a metal layer) which is disposed between two low density layers (for example a photoresist or silicon dioxide). Such an arrangement results in an acoustic impedance mismatch on both sides of the high density layer.

A pulsed pump radiation beam 16 comprising a train of equally spaced pulses may give rise to a narrower acoustic spectrum, which can be useful in some embodiments. For example, it may be advantageous to optimize the amount of acoustic energy that is generated within an optimum acoustic spectrum. The optimum acoustic spectrum may comprise, for example, acoustic wavelengths that are short enough to resolve structure of the feature 4 (for example wavelengths that are not longer than twice the depth of a diffraction grating 4). Additionally or alternatively, the optimum acoustic spectrum may comprise, for example, wavelengths that are sufficiently long so as not to be attenuated by an unacceptable amount.

The measurement performed by the measurement system 14 may use any suitable detection geometry, and can be a single-pixel detector or an interferometric detection or camera-based detection system.

The measurement radiation source 12 and measurement system 14 may form part of any known alignment system or alignement sensor as desired. For example in some embodiments the measurement system 14 may be operable to determine the position of an alignment grating by comparing the phases of the positive and negative diffraction orders. For example, the phases of the plus and minus first order diffraction beams (and/or the plus and minus third order, fifth order, etc. diffraction beams) may be compared. This comparison can be performed by interfering the positive and negative diffraction beams with each other, using of a self-referencing interferometer. The total signal may be measured on, for example, a photodiode. Scanning the alignment grating results in a periodic alignment signal, from which the alignment position is retrieved. Examples of such systems are now described with reference to FIGS. 4 to 6.

FIG. 4(a) shows examples of alignment marks 202, 204, that may be provided on substrate W for the measurement of X-position and Y-position, respectively. Each alignment mark in this example comprises a series of bars formed in a product layer or other layer applied to or etched into the substrate. The bars are regularly spaced and act as grating lines so that the alignment mark may be regarded as a diffraction grating with a sufficiently well-known spatial period (pitch). The bars on the X-direction alignment mark 202 are parallel to the Y-axis to provide periodicity in the X direction, while the bars of the Y-direction alignment mark 204 are parallel to the X-axis to provide periodicity in the Y direction. The alignment system AS (shown in FIG. 1) scans each alignment mark optically with a spot 206 (X direction), 208 (Y direction) of radiation, to obtain a periodically-varying signal, such as a sine wave. The phase of this signal is analysed, to measure the position of the alignment mark, and hence of substrate W, relative to the alignment sensor, which in turn is fixed relative to the frame MF of the apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment system AS uses a wavelength of radiation (or usually plural wavelengths) much longer than the exposure radiation to be used for applying patterns to the substrate. Fine position information can be obtained, however, because the large number of bars allows the phase of a repeating signal to be accurately measured.

Coarse and fine marks may be provided, so that the alignment sensor can distinguish between different cycles of the periodic signal, as well as the exact position (phase) within a cycle. Alignment marks of different pitches may also be used for this purpose. These techniques are again well known to the person skilled in the art, and will not be detailed herein. The design and operation of such sensors is well known in the art, and each lithographic apparatus may have its own design of sensor. The alignment system AS may be generally of the form described in U.S. Pat. No. 6,961,116 (den Boef et al). FIG. 4(b) shows a modified alignment mark for use with a similar alignment system, which X- and Y-positions can be obtained through a single optical scan with the illumination spot 206 or 208. The alignment mark 210 has bars arranged at 45 degrees to both the X- and Y-axes. This combined X- and Y-measurement may be performed using the techniques described in published patent application US 2009/195768 A (Bijnen et al).

It will be appreciated from the above discussion that the alignment marks 202, 204, 210 may be below a top surface of an object, for example covered by one or more process layers, which may be opaque. When operated in the second operational mode, the apparatus 2 shown in FIGS. 2A and 2B, and the associated methods, can be used to generate a signal on the top surface of such an object, using acoustic waves, which is dependent on the underlying alignment mark. It is this signal which the alignment system AS optically scans with a beam spot 206, 208 of radiation. As explained above, the acoustic waves produce a signal that is observable with at least two different optical methods. First, the propagating strain can cause a displacement of the metal lattice. For example, a standing top surface acoustic wave may be generated on the top surface 8 of an object 6 which mirrors the underlying alignment mark. This top surface acoustic wave may act as a diffraction grating for the alignment sensor AS. Additionally or alternatively, the stress related to the acoustic waves induces changes of the dielectric constant via photo-elastic effects, which can result in local differences in the amount of radiation scattered (for example reflected) by the top surface 8 of the object 6. These differences in the reflectivity of the top surface 8 may be used by the alignment sensor AS to determine a position.

Figure 5:
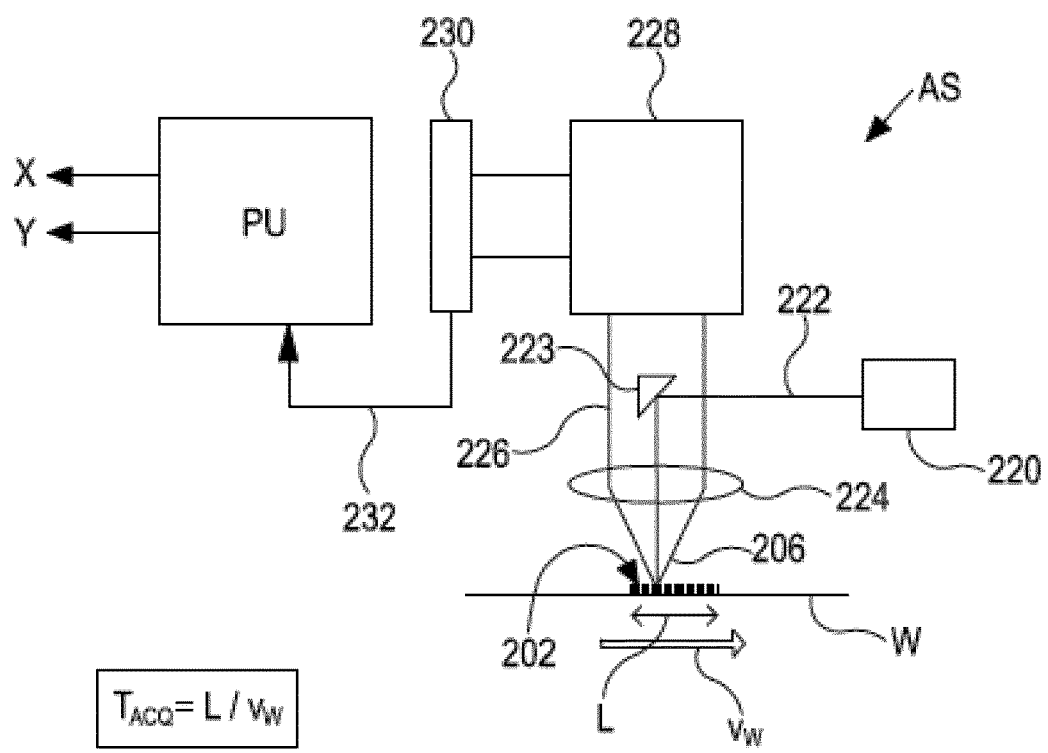
FIG. 5 is a schematic block diagram of a first alignment sensor scanning an alignment mark in the apparatus of FIG. 1A.

FIG. 5 is a schematic block diagram of a known alignment sensor AS. Illumination source 220 provides a measurement beam 222 of radiation of one or more wavelengths, which is diverted by a spot mirror 223 through an objective lens 224 onto an alignment mark, such as alignment mark 202, located on substrate W. As indicated schematically in FIG. 5, in the example of the present alignment sensor based on U.S. Pat. No. 6,961,116 mentioned above, the illumination spot 206 by which the alignment mark 202 is illuminated may be slightly smaller in diameter then the width of the alignment mark itself.

Radiation diffracted by the alignment mark 202 is picked up by an objective lens 224 and collimated into an information-carrying beam 226. A self-referencing interferometer 228 is of the type disclosed in U.S. Pat. No. 6,961,116 mentioned above, and processes beam 226 and outputs separate beams (for each wavelength) onto a sensor array 230. The spot mirror 223 serves conveniently as a zero order stop at this point, so that the information carrying beam 226 comprises only higher order diffracted radiation from the alignment mark 202 (this is not essential to the measurement, but improves signal to noise ratios). Intensity signals 232 from individual sensors in a sensor grid 230 are provided to a processing unit PU, which may form part of the processor PR of FIG. 1. By a combination of optical processing in the block 228 and computational processing in the unit PU, values for X- and Y-position on the substrate relative to the reference frame RF are output. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

As mentioned already, a single measurement of the type illustrated only fixes the position of the alignment mark within a certain range corresponding to one pitch of the alignment mark. Coarser measurement techniques are used in conjunction with this to identify which period of the sine wave is the one containing the marked position. The same process at coarser and/or finer levels may be repeated at different wavelengths for increased accuracy and/or for robust detection of the alignment mark irrespective of the materials from which the alignment mark is made, and materials on and/or below which it sits. The wavelengths may be multiplexed and demultiplexed optically so as to be processed simultaneously, and/or they may be multiplexed by time division or frequency division. Examples in the present disclosure will exploit measurement at several wavelengths to provide a practical and robust measurement apparatus (alignment sensor) with reduced sensitivity to alignment mark asymmetry. Referring to the measurement process in more detail, an arrow labelled $V_w$ in FIG. 5 illustrates a scanning velocity with which spot 206 traverses a length L of the alignment mark 202. In this example, the alignment system AS and spot 206 in reality remain stationary, while it is the substrate W that moves with velocity $V_w$. The alignment sensor can thus be mounted rigidly and accurately to the reference frame RF (FIG. 1), while effectively scanning the alignment mark 202 in a direction opposite to the direction of movement of substrate W. The substrate W is controlled in this movement by its mounting on the substrate table WT and the substrate positioning system PW. All movements shown are parallel to the X axis. Similar actions apply for scanning the alignment mark 204 with spot 208 in the Y direction.

As discussed in the published patent application US 2012-0212749 A1, the high productivity requirements required of the lithographic apparatus require the measurement of the alignment marks at numerous positions on the substrate to be performed as quickly as possible, which implies that the scanning velocity $V_w$ is fast, and the time $T_{ACQ}$ available for acquisition of each alignment mark position is correspondingly short. In simplistic terms, the formula $T_{ACQ}=L/V_w$ applies. The prior application US 2012-0212749 A1 describes a technique to impart an opposite scanning motion of the spot, so as to lengthen the acquisition time. The same scanning spot techniques can be applied in sensors and methods of the type disclosed herein, if desired.

Figure 6:
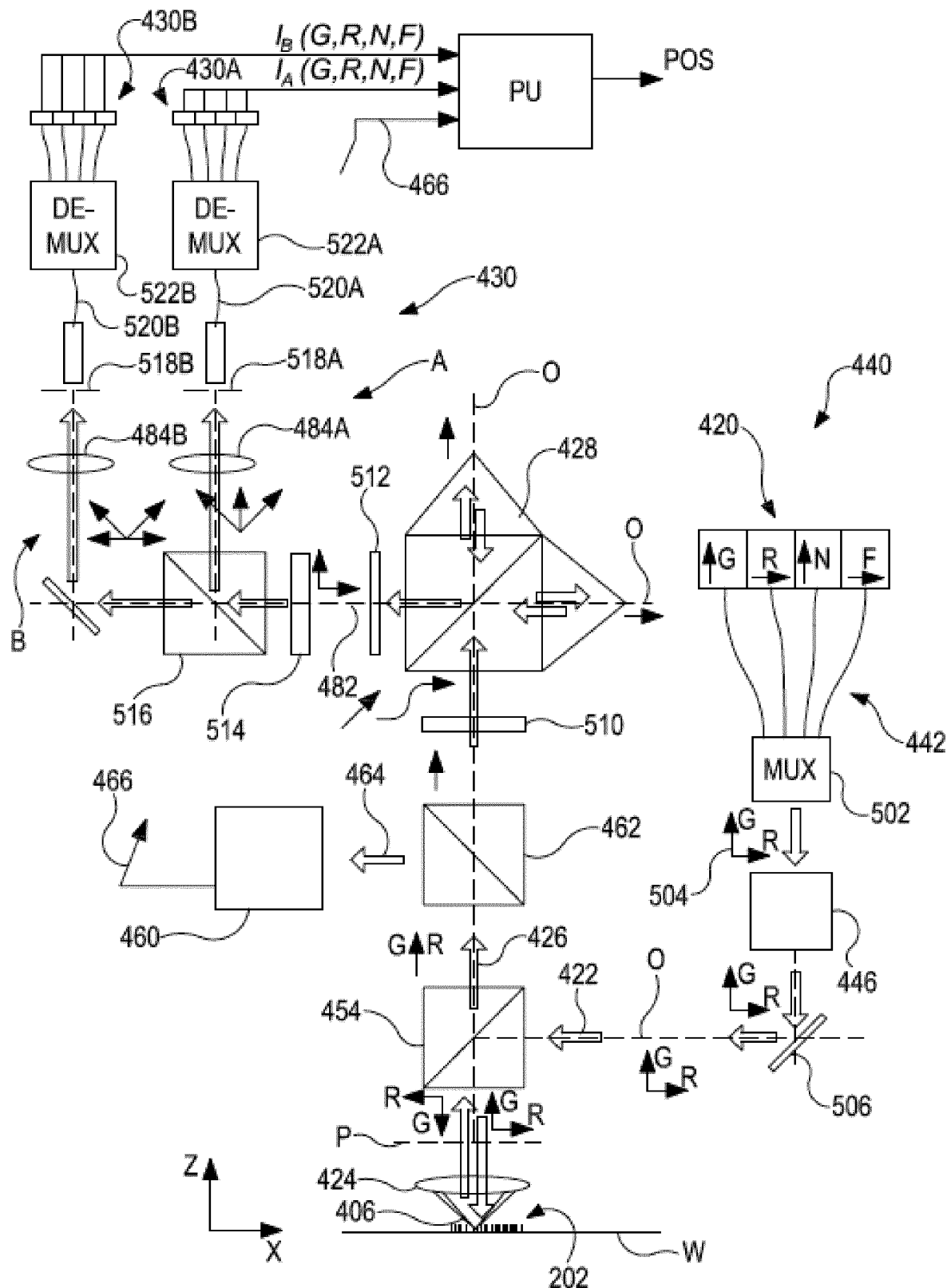
FIG. 6 is a schematic diagram of a second alignment sensor which may be used as the alignment sensor in the apparatus of FIG. 1A, including off-axis illumination and an optional asymmetry measuring arrangement (not shown in detail) and further showing features of multiple wavelengths and polarization.

FIG. 6 illustrates an optical system of an alignment sensor that is a modified version of one described in the prior publications U.S. Pat. No. 6,961,116 and US 2009/195768 mentioned above. This introduces the option of off-axis illumination modes which, among other things, allow a reduced pitch of alignment mark for greater accuracy. The optical system may also allow scatterometry type measurements to be performed with the alignment sensor, rather than with a separate scatterometer instrument. In FIG. 6, for simplicity the details of providing off-axis and on-axis modes of illumination are omitted. For the present disclosure it is more interesting to show details of the multiple wavelengths and polarizations.

An optical axis O which has several branches is indicated by a broken line running throughout the optical system shown in FIG. 6. For ease of comparison with the schematic diagram of FIG. 5, some parts of the optical system shown in FIG. 6 are labelled with reference signs similar to those used in FIG. 5, but with prefix "4" instead of "2". Thus, we see a light source 420, an illumination beam 422, an objective lens 424, an information carrying beam 426, a self-referencing interferometer 428 and a detector arrangement 430. Signals from the detector arrangement are processed by processing unit PU, which is modified so as to implement the novel features described below and to output an (improved) position measurement POS for each alignment mark.

Additional components illustrated in this more detailed schematic diagram are as follows. In an illumination subsystem 440, radiation from source 420 is delivered via optical fibres 442 to an illumination profiling optics 446. This delivers input beam 422 via beam splitter 454 to objective lens 424 having a pupil plane P. Objective lens 424 forms a spot 406 on alignment mark 202/204/210 on the wafer W. Information-carrying beam 426, diffracted by the alignment mark, passes through beam splitter 454 to interferometer 428. Interferometer 428 splits the information carrying beam into two parts with orthogonal polarization, rotates these parts about the optical axis by 180° relative to one another, and combines them into an outgoing beam 482. The outgoing beam 482 enters the detector arrangement 430 as will be described in more detail below.

Included in the present example is an asymmetry measuring arrangement 460. Arrangement 460 receives a part 464 of the information carrying beam 426 through a second beam splitter 462 positioned in advance of the interferometer. Another patent application, US 20125227061, describes techniques for the measurement of asymmetry using position information obtained through the detector 430. It will be appreciated that the asymmetry measuring arrangement 460 is optional and may therefore be omitted in other embodiments.

Illumination profiling optics 446 can take various forms, some of which are disclosed in more detail in prior patent application US 2015109624. In the examples disclosed therein, alignment sensors (more generally, position measuring apparatuses) are shown which allow the use of reduced grating pitches without the need for spatial resolution on the detector side. By use of illumination modes, these apparatuses are able to measure the positions of alignment marks with a wide range of different pitches, for example from less than 1 µm to pitches of 20 micron, without changing the current detector design. A particular feature common to the examples described in the prior application US 2015109624, is the option to use off-axis illumination at a limited range of incidence angles (limited radial extent in the pupil plane). By off-axis illumination, it is meant that source regions of radiation are confined to a peripheral portion of the pupil, that is to say, some distance away from the optical axis. Confining the illumination to an extreme periphery of the pupil reduces the smallest possible pitch of the alignment mark from substantially $\lambda$/NA to substantially $\lambda$/2NA, where $\lambda$ is the wavelength of radiation used, and NA is the numerical aperture of an objective lens of the instrument (e.g. the alignment sensor or more generally the position measuring apparatus). The examples described in the prior application US 2015109624, also use a particular distribution of spot mirrors in a beam splitter of the apparatus, which can both provide the desired illumination and act as a field stop for zero order diffracted radiation. A 'universal' illumination profile can be designed that allows for aligning on any of the X, Y and XY alignment marks without changing the illumination mode, although this inevitably brings some compromise in performance and/or some complication in the apparatus. Alternatively, dedicated modes can be designed and made to be selectable for use with the different alignment mark types. Different polarizations of illumination can be selected also.

The apparatus as a whole need not be limited to providing these particular off-axis illumination profiles. It may have other modes of use, both known or yet to be developed, which favour the use of different profiles. For example, the apparatus may provide for selection of on- and off-axis illumination modes for the different alignment mark types shown in FIGS. 4(a) and (b). While off-axis illumination is of interest for use with finer gratings, an on-axis illumination profile may be useful for compatibility with existing alignment marks and measurement methods. Referring firstly to the example of an on-axis mode, as used in the known sensor of FIG. 5, illumination normal to the substrate is provided by an on-axis illumination profile having a central bright spot within an otherwise dark pupil. This profile is an optional setting in the illumination beam 422 of the apparatus. In this example, it is desired for the zero order beam which returns along the optical axis to be blocked before entry into the interferometer 428, but also for it to be transferred to the asymmetry measuring arrangement 460 (when provided). To block the zero order before the interferometer 428 is not essential, but improves the signal to noise ratio of the position signal. Accordingly, in this embodiment, a spot mirror may be included in the second beam splitter 462. The first splitter 454 is not silvered, and one accepts that only 50% or so of the intensity of the central spot may is transferred to the alignment mark. In an alternative embodiment, where the arrangement 460 is omitted, this profile may be produced directly by illumination profiler 446 and transmitted at full intensity to objective 424 by a spot mirror within the first beam splitter 454. A variety of alternatives can be envisaged to obtain a desired profile.

Off-axis illumination profiles can be produced in a number of ways to form a practical instrument, bearing in mind that the opposed segments should be coherent for the interferometer 428 to produce the desired signal. Particularly when a broadband source is involved, the coherence length/time of the source radiation will be very short. Even with a monochromatic laser source, U.S. Pat. No. 6,961,116 teaches that a short coherence time is preferred, for example to eliminate interference from undesired multiple reflections. Consequently, optical path lengths from the source to each segment should be very closely matched. An aperture corresponding directly to the desired profile could be placed in a widened parallel beam, but that would result in a relatively large light loss. To circumvent the loss of light, various alternative solutions are provided in the prior application US 2015109624, mentioned above.

The illumination emerging from the illumination source 442 may be monochromatic but is typically broadband in nature, for example white light, or polychromatic. It will be appreciated that the illumination source 442 is a source operable to emit electromagnetic radiation. This radiation may comprise visible light and/or electromagnetic radiation outside of the visible spectrum, for example infrared radiation. It will be appreciated that in the following the term "radiation" is synonymous with the term "light" and may be used interchangeably. Similarly, a wavelength (or range of wavelengths) of such radiation may be referred to as the "colour" of the radiation whether the radiation is from the visible spectrum or not. A diversity of wavelengths in the beam increases the robustness of the measurement, as is known. One known sensor uses for example a set of four wavelengths, each of the four wavelengths being in the range 500 nm to 900 nm. These four wavelengths may be referred to by the name of their colours, which may be: green (comprising green light), red (comprising red light), near infrared (comprising radiation in the near infrared) and far infrared (comprising radiation in the far infrared). In a sensor implementing the present invention, the same four wavelengths could be used, or a different four, or more or fewer than four wavelengths might be used.

Referring to FIG. 6 again, aspects of the apparatus concerned with measurement using multiple wavelengths of radiation, and concerned with the management of polarization effects, will now be explained. In the illumination subsystem 440, the source 420 comprises four individual light sources that are provided to produce radiation of four wavelengths named green (labelled G), red (R), near infrared (N) and far infrared (F). For convenience in the following discussion, the radiation at these four different wavelengths will be called four colours of light, it being immaterial for present purposes whether they are in the visible or non-visible parts of the electromagnetic spectrum. The light sources are linearly polarized, with the G and N radiation being oriented the same as one another, and the R and F radiation being polarized orthogonally to the polarization of the G and N radiation.

The four colours are transported by polarization maintaining fibres to a multiplexer 502, where they are combined into a single four-colour beam. The multiplexer maintains linear polarization, as indicated by arrows 504. The arrows 504 and similar arrows throughout the diagram are labelled G and R to indicate polarization of the green and red components. The N and F components are oriented the same as the G and R components, respectively.

This combined beam goes via suitable delivery optics 506 into beam splitter 454. As already described, it then reflects from a partially- or fully reflecting surface (e.g. a 0.5 mm diameter spot mirror), which is inside the beam splitter. The objective lens 424 focuses the beam to a narrow beam which is reflected and diffracted by the grating formed by alignment mark 202 on the wafer W. Light is collected by objective lens 424, with for example a numerical aperture NA=0.6. This NA value allows at least ten orders of diffraction to be collected from a grating with 16 μm pitch, for each of the colours.

The reflected and diffracted light forming information carrying beam 426 is then transported to the self-referencing interferometer 428. In this example, as already described, the beam is split by beam splitter 462 to supply a portion 464 of the information carrying beam to the asymmetry measuring arrangement 460, when provided. Signals 466 conveying asymmetry measurement information are passed from arrangement 460 to the processing unit PU. Just before the interferometer, polarization is rotated by 45° by a half wave plate 510. From this point on, polarization arrows are shown for only one colour, for clarity. The interferometer, as already described above and in the patent U.S. Pat. No. 6,961,116, consists of a polarizing beam splitter, where half of each colour is transmitted, and half of each colour reflected. Each half is then reflected three times inside the interferometer, rotating the radiation field by +90° and −90°, giving a relative rotation of 180°. The two fields are then superimposed on top of each other and allowed to interfere. A phase compensator 512 is present to compensate for path differences of the −90° and 90° image. The polarization is then rotated 45° by another half wave plate 514 (having its major axis set at 22.5° to the X or Y axis). The half wave plates 510, 514 are wavelength insensitive, so that polarizations of all four wavelengths are rotated by 45°.

A further beam splitter 516 splits the optical signal into two paths designated A and B. One path contains the sum of the two rotated fields, and the other contains the difference. Depending on the initial polarization direction, the sum ends up in Path A or Path B. So in this example the sum signals for Green and NIR signals end up in one path, Red and FIR in the other. For each colour, the corresponding difference signal ends up in the other path. It will be appreciated that a radiation source is a source operable to emit radiation, for example electromagnetic radiation. The radiation may comprise visible light. Alternatively, the radiation may comprise electromagnetic radiation outside of the visible spectrum, for example infrared radiation. It will be appreciated that in the above description the term "radiation" is synonymous with the term "light". Any reference to light may therefore encompass electromagnetic radiation outside of the visible spectrum.

Note that this arrangement chooses to use one polarization for illumination in each colour. Measurements with two polarizations per colour could be made, by changing the polarization between readings (or by time division multiplexing within a reading). However, to maintain high throughput while benefiting from some diversity in colour and polarization, a set of different colours, each colour being linearly polarized and with one subset of the colours having one polarization direction and another subset of the colours having a different polarization direction, represents a good compromise between diversity and measurement throughput. To increase diversity without impacting throughput, one can envisage an implementation similar to the four-colour scheme presented here, but using more colours, for example eight or sixteen, with mixed polarizations.

The light for each path A and B is collected by a respective collector lens assembly 484A and 484B. It then goes through an aperture 518A or 518B that eliminates most of the light from outside the spot on the substrate. Two multimode fibres 520A and 520B transport the collected light of each path to respective demultiplexers 522A and 522B. The demultiplexers 522A, 522B split each path in the original four colours, so that a total of eight optical signals are delivered to detectors 430A and 430B within detector arrangement 430. In one practical embodiment, fibres are arranged between the demultiplexers and eight detector elements on a detector circuit board. The detectors in this example provide no spatial resolution, but deliver time-varying intensity signals $I_A$ and $I_B$ for each colour, as the apparatus scans the alignment mark 202 on substrate W. The signals are actually position-dependent signals, but received as time-varying signals (waveforms) synchronized with the physical scanning movement between the apparatus and the alignment mark (recall FIG. 5).

Processing unit PU receives the intensity waveforms from the eight detectors and processes these as in the known apparatus to provide a position measurement POS. Because there are eight signals to choose from, based on different wavelengths and incident polarizations, the apparatus can obtain useable measurements in a wide variety of situations. In this regard it should be remembered that the alignment mark 202 may be buried under a number of layers of different materials and structures. Some wavelengths will penetrate different materials and structures better than others. The processing unit PU conventionally processes the waveforms and provides a position measurement based on the one which is providing the strongest position signal. The remaining waveforms may be disregarded. In a simple implementation, the 'recipe' for each measurement task may specify which signal to use, based on advance knowledge of the target structure, and experimental investigations. In more advanced systems an automatic selection can be made, using "Color Dynamic" or "Smooth Color Dynamic" algorithms to identify the best signals without prior knowledge. This is described by Jeroen Huijbregtse et al in "Overlay Performance with Advanced ATHENA™ Alignment Strategies", Metrology, Inspection, and Process Control for Microlithography XVII, Daniel J. Herr, Editor, Proceedings of SPIE Vol. 5038 (2003).

Each lens 484A, 484B focuses the entire field onto each element of each detector 430A, 430B, which is an arrangement similar to the known alignment sensor of FIG. 5. The detectors in this example and in the known alignment sensor are effectively single photodiodes and do not provide any spatial information except by the scanning motion described already. A detector having spatial resolution in a conjugate pupil plane can be added, if desired. This may, for example, allow angle-resolved scatterometry methods to be performed using the alignment sensor hardware.

The alignment mark may need to be scanned more than once if it is desired for example to measure position using two different polarizations. Also it may be required to switch the illumination mode midway through scanning the XY alignment mark. In other embodiments, however, multiplexing of optical signals may be used so that two measurements can be made simultaneously. Similarly, multiplexing can be applied so that different portions of the XY alignment mark can be scanned and measured without switching illumination mode. A simple way to perform such multiplexing is by frequency division multiplexing. In this technique, radiation from each pair of spots and/or polarization is modulated with a characteristic frequency, selected to be much higher than the frequency of the time-varying signal that carries the position information. The diffracted and processed optical signals arriving at each detector 430A, 430B will be a mixture of two signals, but they can be separated electronically using filters tuned to the respective frequencies of the source radiation. Time division multiplexing could also be used, but this would require accurate synchronization between source and detector. The modulation at each frequency can be a simple sine or square wave, for example.

If it is desired to illuminate an alignment mark with circular polarization, whether for position sensing or some other form of metrology, a quarter wave plate (not shown) can be inserted between beam splitter 454 and objective 424. This has the effect of turning a linear polarization into a circular one (and changing it back again after diffraction by the alignment mark). The spot positions are chosen as before according to the alignment mark direction. The direction of circular polarization (clockwise/counter clockwise) can be changed by selecting a different linear polarization in the illumination source 420, optical fibres 442 or illumination profiling optics 446.

Also described in the paper by Huijbregtse et al is the use of multiple gratings in a composite target. Each grating has a different profile, enhancing for example higher diffraction orders (3rd, 5th, 7th). Position measurements can be derived from different ones of these gratings, as well as from different colour signals on an individual grating. In the present disclosure, it is assumed that there is a single grating with a simple bar pattern, but having segmented features. The skilled reader can readily expand the disclosure to envisage embodiments having multiple gratings with different patterns.

Figure 7B:
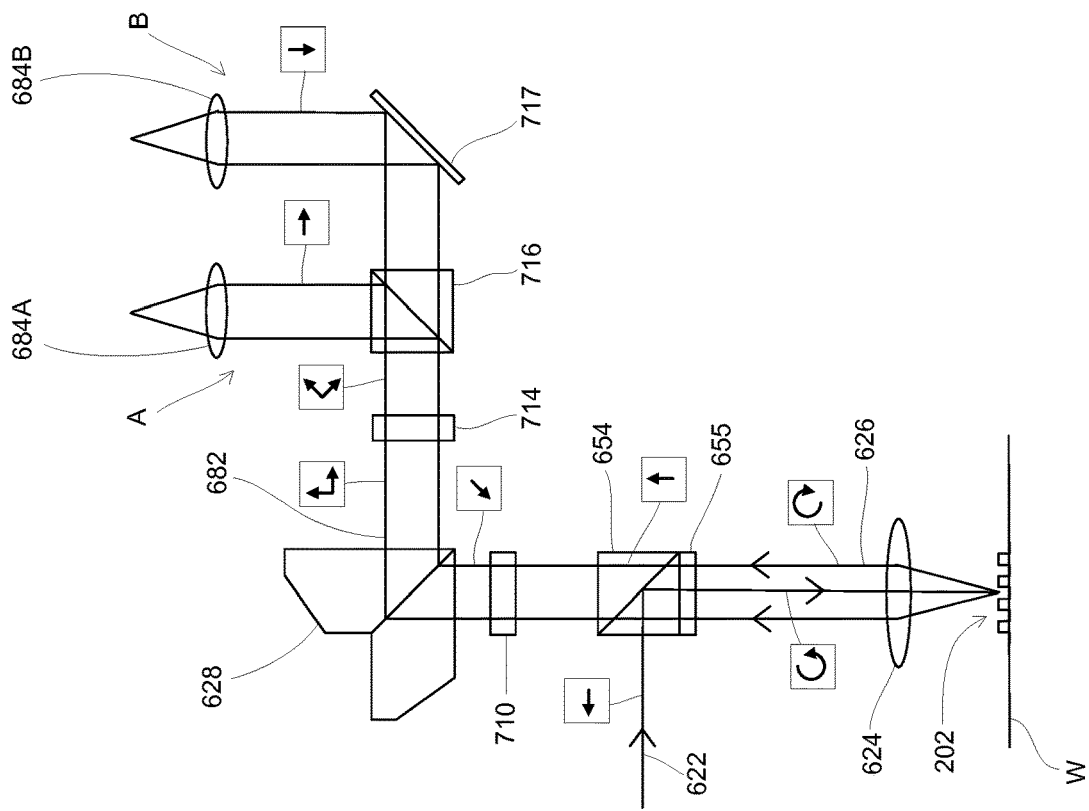
FIG. 7B is a schematic illustration of the optical system of the third alignment sensor shown in FIG. 7A, showing the propagation of a second input polarization state.
Figure 7A:
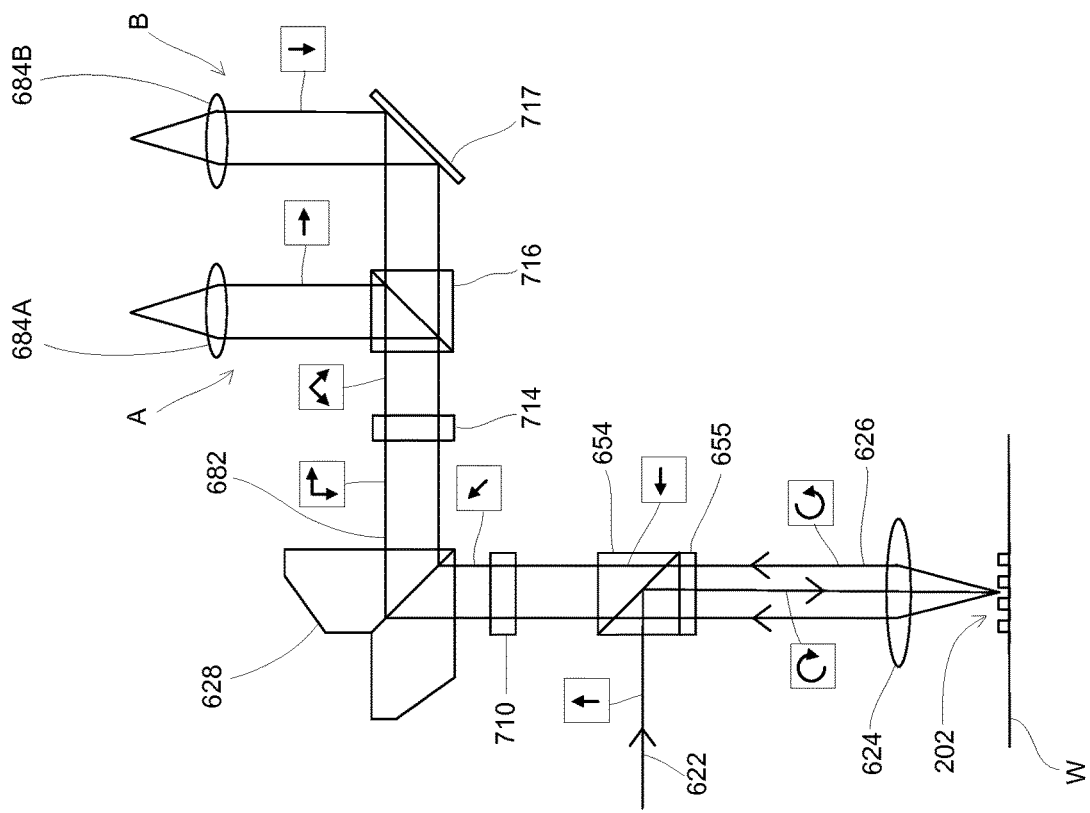
FIG. 7A is a schematic illustration of an optical system of a third alignment sensor which may be used as the alignment sensor in the apparatus of FIG. 1A, which is similar to the alignment sensor shown in FIG. 6, showing the propagation of a first input polarization state.

FIGS. 7A and 7B illustrate, schematically, an optical system of an alignment sensor that is similar to the alignment sensor shown in FIG. 6 and described above. FIG. 7A and FIG. 7B represent the propagation of two orthogonal linear polarization states for an input radiation beam 622 produced by a radiation source (not shown). In FIGS. 7A and 7B, the polarization state of the radiation at different positions is represented by an arrow in a square. This representation of the polarization states of radiation within the optical system of the alignment sensor represents the polarization state of the radiation as would be viewed by an observer looking into the radiation beam in which linear polarization is represented by a straight arrow and circular polarization is represented by a curved arrow.

For ease of comparison with FIG. 6, parts of the optical system shown in FIGS. 7A and 7B which correspond to parts of the optical system shown in FIG. 6 are labelled with reference signs similar to those used in FIG. 6, but with prefix "6" instead of "4" or with a prefix "7" instead of "5".

Although not shown in FIGS. 7A and 7B (to aid the clarity of these Figures), it will be appreciated that the input radiation beam 622 may comprise a plurality of wavelengths of radiation which are multiplexed and de-multiplexed in a similar manner to the alignment sensor shown in FIG. 6. For example, an illumination subsystem (not shown) similar to the illumination subsystem 440 described above may be used and a detector arrangement (not shown) similar to the detector arrangement 430 described above could be used.

The input beam 622 is delivered to objective lens 624 via beam splitter 654 and quarter wave plate 655. The quarter wave plate 655 converts the incident plane polarized radiation into circularly polarized radiation. As shown in FIG. 7A, when the input beam 622 is vertically plane polarized, the quarter wave plate 655 converts it into left circularly polarized radiation (note that in FIGS. 7A and 7B the representation of the polarization states of radiation within the optical system of the alignment sensor represents the polarization state of the radiation as would be viewed by an observer looking into the radiation beam). Similarly, as shown in FIG. 7B, when the input beam 622 is horizontally plane polarized, the quarter wave plate 655 converts it into right circularly polarized radiation.

The circularly polarized radiation is projected onto an alignment mark 202 on the wafer W by objective lens 624. Assuming that the alignment mark 202 comprises a non-polarizing grating, the polarization of the scattered radiation which forms the information-carrying beam 626 (i.e. the diffraction orders) will be flipped by $\pi$ radians (180°). Therefore, the incident left circularly polarized radiation in FIG. 7A becomes right circularly polarized radiation in the information-carrying beam 626 and the incident right circularly polarized radiation in FIG. 7B becomes left circularly polarized radiation in the information-carrying beam 626.

The quarter wave plate 654 converts the radiation back into linearly polarized radiation, wherein the right circularly polarized radiation is converted into horizontally polarized radiation (see FIG. 7A) and the left circularly polarized radiation is converted into vertically polarized radiation (see FIG. 7B).

The information-carrying beam 626, diffracted by the alignment mark, passes through beam splitter 654 to interferometer 628 via half wave plate 710. Half wave plate 710 rotates the polarization of the (linearly polarized) information-carrying beam 626 by π/4 radians)(45°) before it passes into the self-referencing interferometer 628.

Self-referencing interferometer 628 generates two mirrored diffraction images with orthogonal polarizations which together form an outgoing beam 682. Self-referencing interferometer 628 may be generally of the form of self-referencing interferometer 428 described above with reference to FIG. 6. For example, the self-referencing interferometer 628 may be generally of a form as disclosed in U.S. Pat. No. 6,961,116, consisting of a polarizing beam splitter, arranged to transmit half of the incident radiation and to reflect half of the incident radiation. Each half of the radiation is then reflected three times inside the interferometer 628, rotating the radiation field by +90° and −90° respectively, giving a relative rotation of 180°. The two fields are then superimposed onto of each other (although they do not interfere yet since they have orthogonal polarization states).

The outgoing beam 482 is incident on polarizing beam splitter 716 via a half wave plate 714. The polarization states of both parts of the outgoing beam 682 are rotated by π/4 radians (45°) by the half wave plate 714 (having its major axis set at 22.5° to the x or y axis).

Beam splitter 716 splits the optical signal into two paths designated A and B. The path designated A contains vertically polarized radiation whereas the path designated B contains horizontally polarized radiation. One path contains the sum of the two rotated fields, and the other contains the difference. Depending on the initial polarization direction, the sum ends up in Path A or Path B. When the input beam 622 is vertically plane polarized (as in FIG. 7A) the difference of the two rotated fields propagates along path A and the sum of the two rotated fields propagates along path B. When the input beam 622 is horizontally plane polarized (as in FIG. 7B) the difference of the two rotated fields propagates along path B and the sum of the two rotated fields propagates along path A. Therefore, it will be appreciated that the optical system of an alignment sensor shown in FIG. 7A and FIG. 7B is an example of an optical system whose output is dependent on the polarization state of the input beam 622. Path A and Path B may be provided with suitable focusing optics 684A, 684B for focusing the sum or difference of the two rotated fields onto a detector.

In principle either the sum or the difference signal may be used by the alignment sensor. However, the sum channel also contains the $0^{th}$ diffraction order which results in an offset in the measurement. From a dynamic range point of view this may be undesirable and therefore it may be preferred to use the difference channel.

Figure 8A:
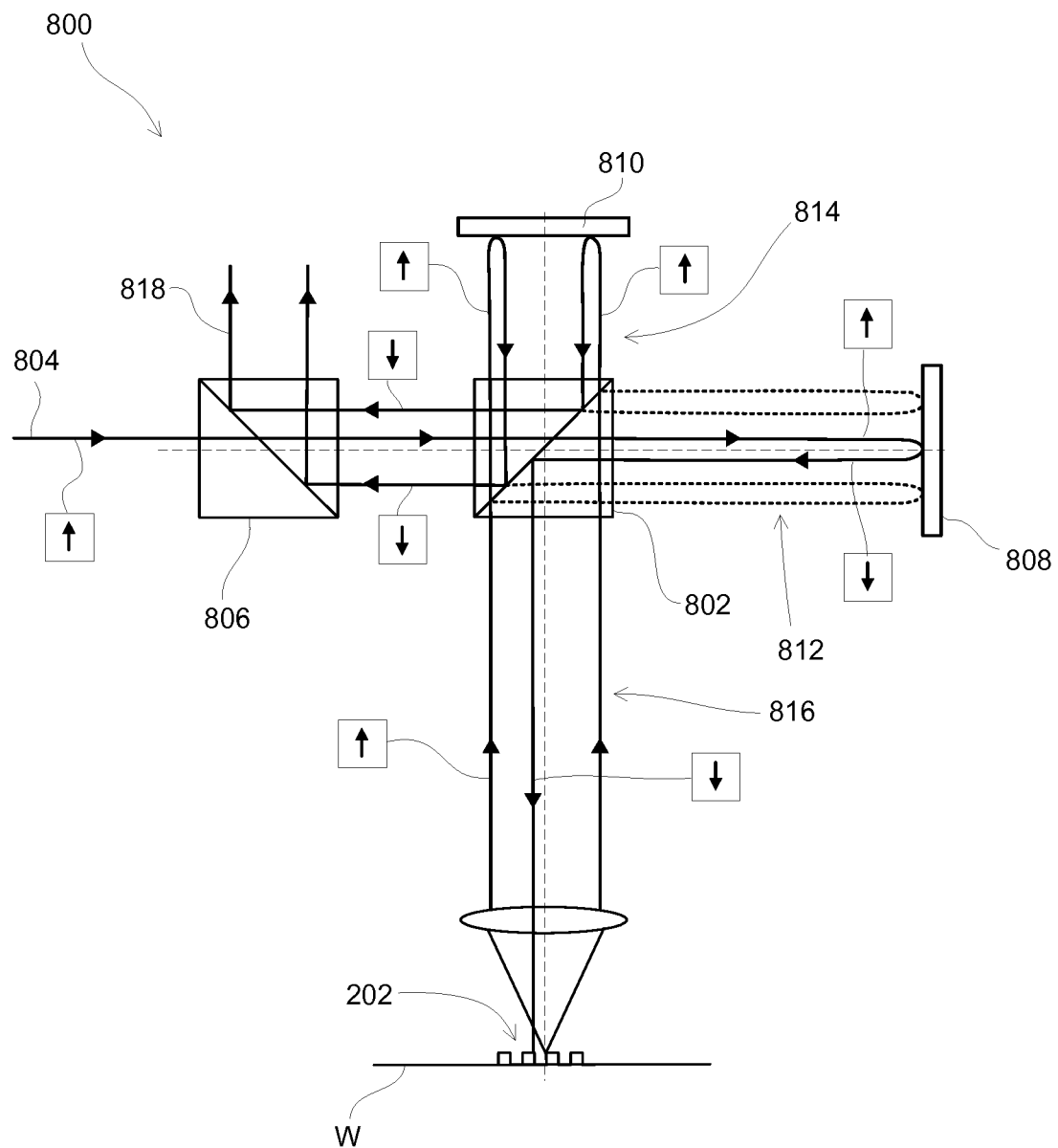
FIG. 8A is a schematic illustration of a polarization independent interferometer which may form part of an alignment sensor according to an embodiment of the present invention, showing the propagation path for a first portion of an input radiation beam.
Figure 8B:
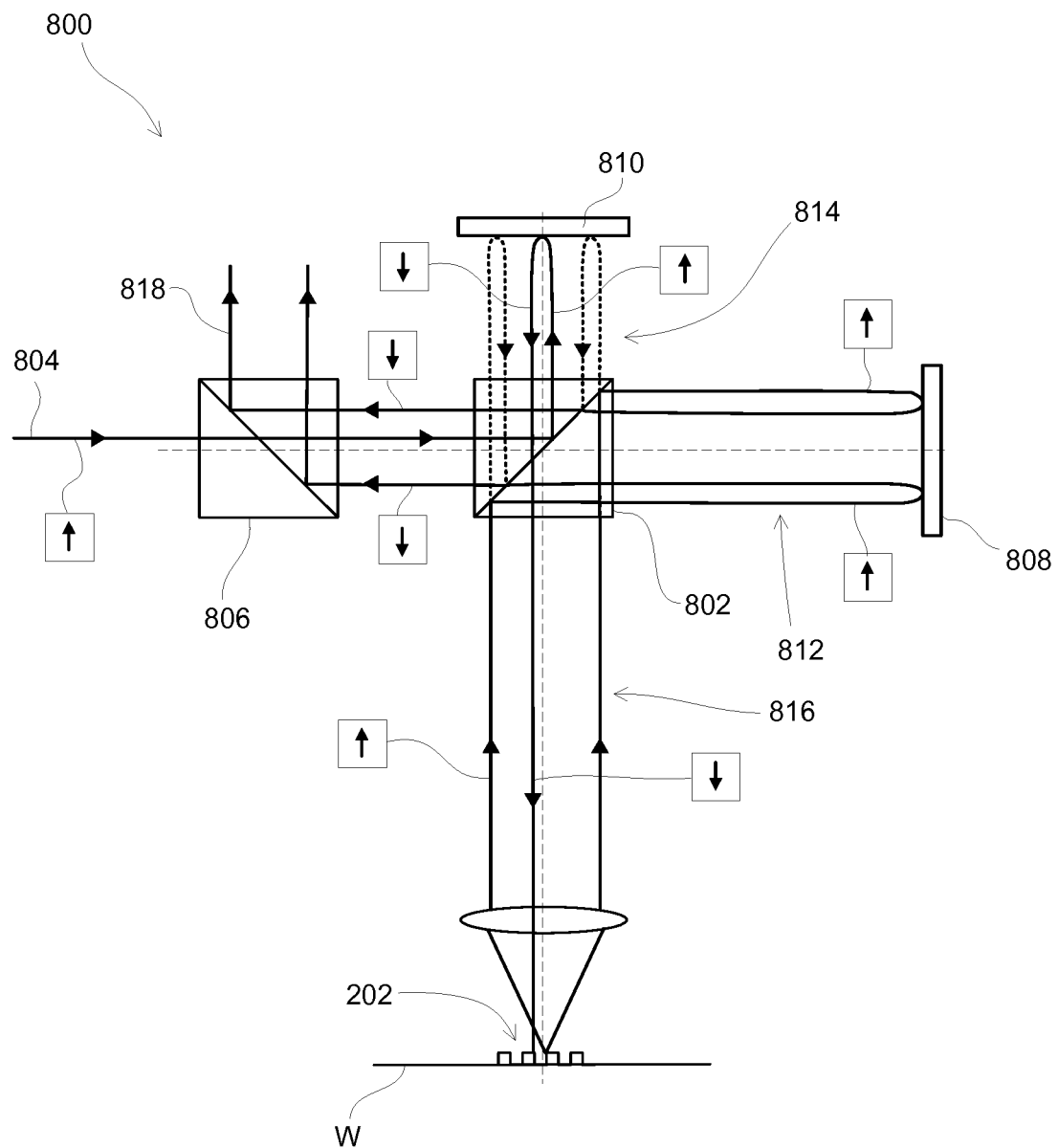
FIG. 8B is a schematic illustration of the polarization independent interferometer as shown in FIG. 8A, showing the propagation path for a second portion of an input radiation beam.

FIGS. 8A and 8B illustrate, schematically, a polarization independent interferometer 800 which may form part of an alignment sensor according to an embodiment of the present invention. In FIGS. 8A and 8B, the polarization state of the radiation at different positions is represented by an arrow in a square. Again, this representation of the polarization states of radiation within the optical system of the alignment sensor represents the polarization state of the radiation as would be viewed by an observer looking into the radiation beam.

The interferometer 800 comprises a polarization independent beam splitter 802. The polarization independent beam splitter 802 is arranged to receive an input radiation beam 804 via a second polarization independent beam splitter 806. The input radiation beam 804 may comprise measurement radiation from a measurement radiation source.

The interferometer further comprises a first mirror 808 and a second mirror 810. The first and second mirrors 808, 810 may each be considered to be a reflective optical element. A first optical path 812 is defined between the polarization independent beam splitter 802 and first mirror 808. It will be appreciated that the first optical path 812 is a two-way optical path. For example, radiation can propagate from the polarization independent beam splitter 802 to first mirror 808, be reflected from the first mirror 808 and return to the polarization independent beam splitter 802. Upon reflection from the first mirror 808, the polarization state of the radiation is rotated by π radians (180°). Similarly, a second optical path 814 is defined between the polarization independent beam splitter 802 and second mirror 810. It will be appreciated that the second optical path 814 is a two-way optical path. For example, radiation can propagate from the polarization independent beam splitter 802 to second mirror 810, be reflected from the second mirror 810 and return to the polarization independent beam splitter 802. Upon reflection from the second mirror 810, the polarization state of the radiation is rotated by π radians (180°).

The interferometer further defines a third optical path 816, the third optical path 816 being a two-way optical path defined between the polarization independent beam splitter 802 and an object, for example an alignment mark 202 on a wafer W. It will be appreciated that the third optical path 816 is a two-way optical path. For example, radiation can propagate from the polarization independent beam splitter 802, irradiate, and scatter from, the surface of the object (for example an alignment mark 202 on a wafer W), and propagate back to the polarization independent beam splitter 802. In the example shown in FIGS. 8A and 8B, after propagating along the third optical path 816, the polarization state of the radiation is rotated by π radians (180°) (in the example, as a result of the scattering from the alignment mark 202).

It will be appreciated that within the interferometer 800, which comprises a beam splitter 802 that is polarization independent, each time a portion of radiation is incident on the beam splitter 802 a first fraction (for example approximately half) of the incident radiation will be directed along a first path and a second fraction (for example approximately half) of the incident radiation will be directed along a second path.

The polarization independent beam splitter 802 is arranged to receive an input radiation beam 804 via the second polarization independent beam splitter 806. In the example shown in FIGS. 8A and 8B, the incident radiation beam 806 is vertically polarized although it will be appreciated that in alternative embodiments other polarization states may be used. In general the input radiation beam 804 is linearly polarized and may have any polarization state as desired or required. As will be discussed further below with reference to FIG. 9, a suitable polarization state for the input radiation beam 804 may be selected bearing in mind any polarization dependent optics that may be disposed in the third optical path 816.

As the input radiation beam 804 is incident on the beam splitter 802 for a first time, for example, approximately half of the incident radiation will be directed along the first optical path 812 (as shown in FIG. 8A) and, for example, approximately half of the incident radiation will be directed along the second optical path 814 (as shown in FIG. 8B).

When the portion of the radiation, that was directed along the first optical path 812, returns to the beam splitter 802 approximately half of the incident radiation will be directed along the third optical path 816 and approximately half of the incident radiation (not shown in FIG. 8A to aid the clarity of the Figure) will be output by the system. Similarly, when the portion of the radiation that was directed along the second optical path 814 returns to the beam splitter 802 approximately half of the incident radiation will be directed along the third optical path 816 and approximately half of the incident radiation will be output by the system (not shown in FIG. 8B to aid the clarity of the Figure).

When the portions of the radiation, that were directed along the third optical path 816, return to the beam splitter 802 approximately half of the incident radiation (indicated by dotted line in FIG. 8A and solid line in FIG. 8B) will be directed along the first optical path 812 and approximately half of the incident radiation (indicated by solid line in FIG. 8A and dotted line in FIG. 8B) will be directed along the second optical path 814. It will be appreciated that by using an interferometer 800 comprising a beam splitter 802 that is polarization independent there will be a plurality of portions of radiation that are output by the system and that, in general, these portions of measurement radiation are output by the system at different times.

The polarization independent beam splitter 802 is arranged to receive the input radiation beam 804 and to generate from the input radiation 804 a plurality of portions of radiation. In particular, said plurality of portions of radiation comprises a first portion and a second portion, as will now be described with reference to FIGS. 8A and 8B respectively.

The first portion is directed to along the first optical path 812 then irradiates, and scatters from, a surface of the substrate W, and is then directed along the second optical path 814. The propagation path of the first portion is indicated in FIG. 8A with a solid line. The second portion is directed to along the second optical 814 path then irradiates, and scatters from, a surface of the substrate W, and is then directed along the first optical path 812. The propagation path of the second portion is indicated in FIG. 8B with a solid line. The first and second portions are combined in the polarization independent beam splitter 802 and are directed via second polarization independent beam splitter 806 to form part of output radiation beam 818. Since the first and second portions have the same polarization when they are combined, they will interfere.

As explained above, in the example shown in FIGS. 8A and 8B, after propagating along the third optical path 816, the polarization state of the radiation is rotated by π radians (in the example, as a result of the scattering from the alignment mark 202). However, it will be appreciated that the first and second portions will have the same polarization when they are combined, and they will therefore interfere, irrespective of the net change in the polarization state of after propagating along the third optical path 816. For example, as will be described with reference to FIG. 9, in some embodiments after propagating along the third optical path 816, the polarization state of the radiation is rotated by π/2 radians (90°).

The first and second optical paths 812, 814 have different lengths. The first optical path 812 is longer than the second optical path 814. Therefore it takes longer for the radiation to propagate along the first optical path 812 than to propagate along the second optical path.

It will be appreciated that, in addition to the above described first and second portions, the interferometer 800 will also produce additional portions of the input radiation 804 which form part of output radiation beam 818. However, as now explained, these additional portions will be temporally resolved from the first and second portions within the output radiation beam 818 (which temporally overlap). Therefore the interference between the first and second portions may be determined from a temporal portion of the output radiation beam 818 which corresponds to a time taken to propagate along the first, second and third optical paths 812, 814, 816 sequentially (in any order).

As explained above, as the input radiation beam 804 is incident on the beam splitter 802 for a first time, approximately half of the incident radiation will be directed along the first optical path 812 (as shown in FIG. 8A) and approximately half of the incident radiation will be directed along the second optical path 814 (as shown in FIG. 8B).

First, consider the incident radiation that, following this first incidence on the beam splitter 802, is directed along the first optical path 812 (as shown in FIG. 8A). When this portion of the radiation returns to the beam splitter 802 approximately half of the incident radiation will be directed along the third optical path 816 and approximately half of the incident radiation (not shown in FIG. 8A to aid the clarity of the Figure) will be output by the system. When the portion that was directed along the third optical path 816 returns to the beam splitter 802 approximately half of the incident radiation (indicated by a dotted line in FIG. 8A) will be directed back along the first optical path 812 and approximately half of the incident radiation (indicated by a solid line in FIG. 8A) will be directed along the second optical path 814. If the portion (indicated by a dotted line in FIG. 8A) that was directed back along the first optical path 812 (or a portion thereof) now exits the interferometer to form part of output radiation beam 818, it will have propagated twice along the first optical path 812 and once along the third optical path 816. In contrast, the first portion of the incident radiation 804 (indicated by a solid line in FIG. 8A) will have propagated along the first optical path 812, the second optical path 814 and the third optical path 816. Since the first optical path 812 is longer than the second optical path 814, the portion of radiation indicated by the dotted line in FIG. 8A will exit the interferometer 800 later than the first portion of radiation.

Second, consider the incident radiation that, following this first incidence on the beam splitter 802, is directed along the second optical path 814 (as shown in FIG. 8B). When this portion of the radiation returns to the beam splitter 802, approximately half of the incident radiation will be directed along the third optical path 816 and approximately half of the incident radiation (not shown in FIG. 8B to aid the clarity of the Figure) will be output by the system. When the portion that was directed along the third optical path 816 returns to the beam splitter 802, approximately half of the incident radiation (indicated by dotted line in FIG. 8B) will be directed back along the second optical path 814 and approximately half of the incident radiation (indicated by solid line in FIG. 8B) will be directed along the first optical path 812. If the portion (indicated by dotted line in FIG. 8B) that was directed back along the second optical path 814 (or a portion thereof) now exits the interferometer 800 to form part of output radiation beam 818, it will have propagated twice along the second optical path 814 and once along the third optical path 816. In contrast, the second portion of the incident radiation 804 (indicated by solid line in FIG. 8B) will have propagated along the first optical path 812, the second optical path 814 and the third optical path 816. Since the first optical path 812 is longer than the second optical path 814, the portion of radiation indicated by the dotted line in FIG. 8B will exit the interferometer 800 later than the second portion of radiation.

According to an embodiment of the present invention there is provided an apparatus for determining a characteristic of a feature of an object, the feature being disposed on or below a top surface of the object, that comprises the alignment sensor shown in FIGS. 7A and 7B and the interferometer shown in FIGS. 8A and 8B. Such an apparatus 900 is shown in FIG. 9.

Figure 9:
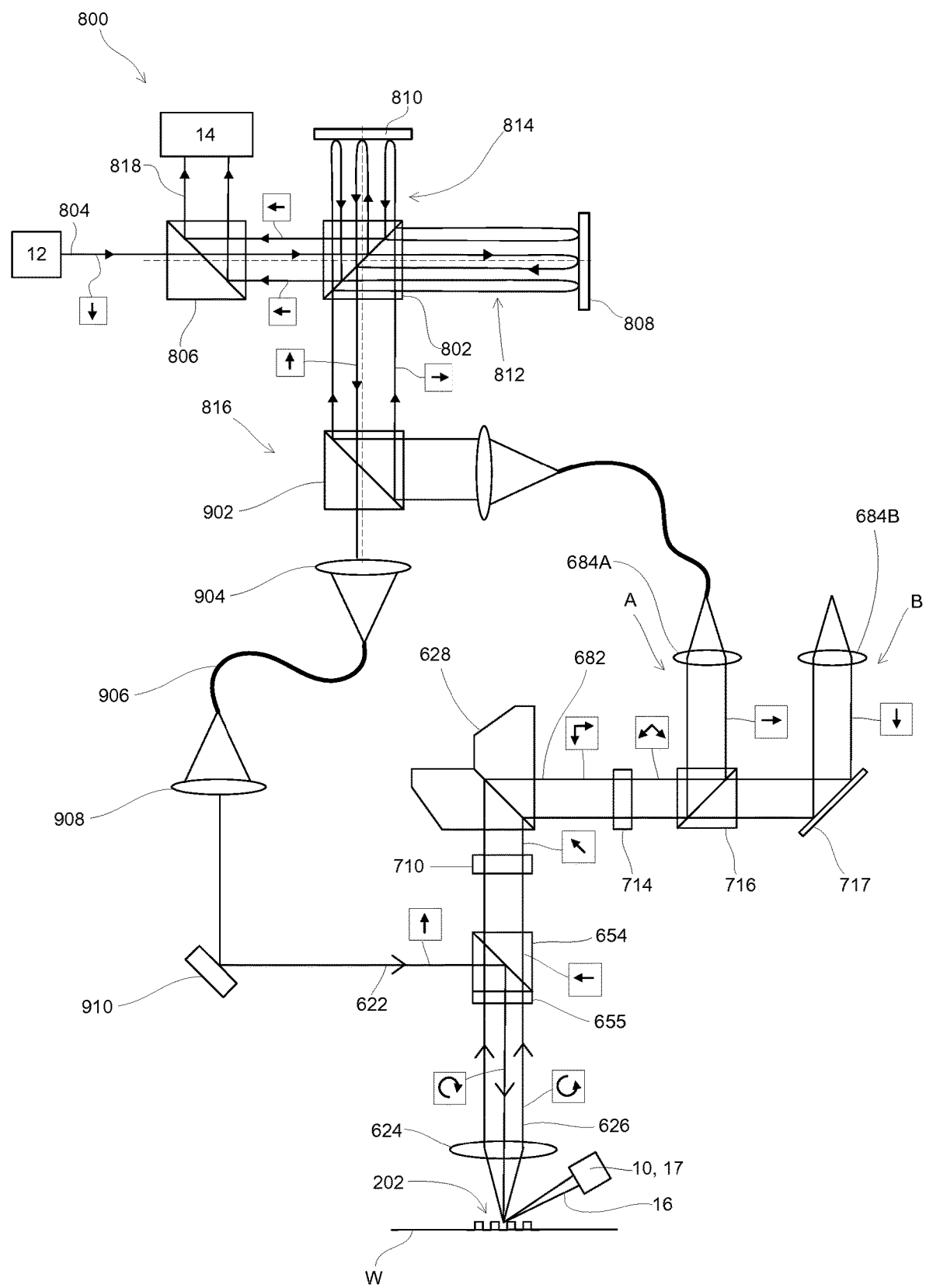
FIG. 9 is a schematic illustration of is a schematic illustration of an apparatus according to an embodiment of the invention for determining a characteristic of a feature of an object and which comprises the third alignment sensor shown in FIGS. 7A and 7B in combination with the polarization independent interferometer as shown in FIGS. 8A and 8B.

It will be appreciated that the apparatus 900 shown in FIG. 9 may be generally of the form of the apparatus 2 shown schematically in FIGS. 2A and 2B and described above and may incorporate any of the features of said apparatus 2 as desired. The alignment sensor shown in FIGS. 7A and 7B and the interferometer 800 shown in FIGS. 8A and 8B are combined with a measurement radiation source 12, a measurement system 14 and a pump radiation source 10 as, which may each be substantially the same as discussed above. The pump radiation source 10, the pump radiation 16 the pump radiation delivery system 17 are shown rather schematically in FIG. 9.

The apparatus 900 shown in FIG. 9 comprises a measurement radiation source 12 that is operable to produce measurement radiation 804. It will be appreciated that the measurement radiation forms the input radiation beam 804 received by the interferometer 800.

As described above with reference to FIGS. 8A and 8B, the polarization independent interferometer 800 has a first optical path 812 and a second optical path 814 and comprises a polarization independent beam splitter 802 arranged to receive the measurement radiation 804 from the measurement radiation source 12 and to generate first and second portions.

The pump radiation source 10 is operable to produce pump radiation 16 for irradiating (via pump radiation delivery system 17) the top surface of the substrate W with the pump radiation 16 so as to produce a mechanical response in the substrate W.

The apparatus 900 shown in FIG. 9 further comprises a measurement system 14 operable to receive output radiation beam 818 from the interferometer 800 and to determine a characteristic of the feature of the object in dependence thereon.

In order to combine the alignment sensor shown in FIGS. 7A and 7B with the interferometer 800 shown in FIGS. 8A and 8B, the third optical path 816 is comprises a polarization independent beam splitter 902.

As each of the first and second portions of the measurement radiation 804 propagates along the third optical path 816 away from the central polarization independent beam splitter 802, part of each of these portions of the measurement radiation passes through the polarization independent beam splitter 902 and is delivered to the alignment sensor as input beam 622 via beam transport optics. In this example, the beam transport optics comprises focusing optics 904, an optical fibre 906, collimating optics 908 and a mirror 910.

Each of the first and second portions of the measurement radiation 804 propagates through the alignment sensor substantially as described above with reference to FIG. 7A.

A portion of each of the first and second portions of the measurement radiation 804 is output through path A via focusing optic 684A. This portion of each of the first and second portions of the measurement radiation 804 is delivered to the polarization independent beam splitter 902 via beam transport optics. In this example, the beam transport optics comprises an optical fibre 912 and collimating optics 914.

The apparatus 900 shown in FIG. 9 provides an apparatus (which may function as a position detector or alignment system) that can be used to determine a characteristic of a feature of an object (for example a position of the alignment mark 202). The apparatus 900 may be operable to determine the characteristic of the feature using both the pump radiation 16 and the measurement radiation 804 as a pump-probe arrangement. The pump radiation 16 is used to produce a mechanical response in the object (for example substrate W). The mechanical response may, for example, be a mechanical wave. It will be appreciated that such mechanical waves may comprise acoustic waves or any other propagation of heat such as, for example, diffusion of free electrons. The mechanical wave generated by the pump radiation 16 may propagate through the object and a portion of it may be scattered by the feature (for example an alignment mark disposed below the top surface of the substrate W) and propagate back to the top surface. The measurement radiation 804 is used to probe the top surface of the object so as to indirectly determine one or more characteristics of the feature. This pump-probe arrangement may be used, for example, when the feature (for example alignment mark 202) is disposed below the top surface and, in particular, when an opaque material (for example an opaque layer formed from metal) is disposed between the top surface and the feature.

By directing the first and second portions of the measurement radiation 804 along two different paths, each formed from the same component optical paths (namely the first, second and third optical paths 812, 814, 816) but in a different order, the measurement radiation 804 can be incident on the surface of the object at two different times and then be combined to interfere. For example, the second portion of the measurement radiation 804 may be incident on the surface before pump radiation 16 from the pump radiation source 10 is incident on the surface whereas the first portion of the measurement radiation 804 may be incident on the surface after pump radiation 16 from the pump radiation source 10 is incident on the surface. With such an arrangement, the second portion of the measurement radiation may contain information dependent on a generally time-independent surface topography of the object whereas the second portion of the measurement radiation may contain information dependent on both this generally time-independent surface topography of the object and on a time dependent signal generated by an acoustic echo from a generated mechanical wave. By combining the first and second portions of the measurement radiation 804, it is possible to separate the time dependent signal generated by an acoustic echo of a generated mechanical wave from the generally time-independent surface topography of the object.

By determining (using measurement system 14) the characteristic of the feature of the object (for example the position of alignment mark 202) in dependence on a temporal portion of an output radiation beam 818 that corresponds to a portion of the output radiation that corresponds to a time taken to propagate along the first optical path 812, irradiate and scatter from the surface of the object 202, and propagate along the second optical path 814, it is possible to separate out a time dependent signal generated by an acoustic echo from a generated mechanical wave from a generally time-independent surface topography of the object.

It will be appreciated that the time taken for the measurement radiation 804 to propagate along the first optical path 812, irradiate and scatter from the surface of the object, and propagate along the second optical path 814 will be dependent on the total optical path length of the first, second and third optical paths 812, 814, 816 and the propagation speed of the measurement radiation. It will be further appreciated that it will take a non-zero the time for the measurement radiation 804 to propagate from the measurement radiation source 12 to the polarization independent beam splitter 802, said time being dependent on the total optical path length between the measurement radiation source 12 and the polarization independent beam splitter 802 (and the propagation speed of the measurement radiation). It will be further appreciated that it will take a non-zero the time for the output radiation 818 to propagate from the polarization independent beam splitter 802 to a detector or sensor within measurement system 14, said time being dependent on the total optical path length between the polarization independent beam splitter 802 and said detector or sensor (and the propagation speed of the measurement radiation).

It will be appreciated that a portion of the output radiation 818 that corresponds to a time taken to propagate along the first, second and third optical paths 812, 814, 816 is intended to mean a part of the output radiation 818 that is received (for example by a sensor or detector) some time after it is generated (for example by a measurement radiation source 12), that time corresponding to the time taken to propagate from the measurement radiation source 12 to the beam splitter 802, along the first, second and third optical paths 812, 814, 816 and then from the beam splitter 802 to the detector or sensor.

Advantageously, by using an interferometer 800 comprising a beam splitter 802 that is polarization independent, the interferometer 800 is insensitive to any changes in the polarization state caused by any optics within the alignment sensor. Furthermore, it allows the first and second portions of the input measurement radiation 804 (which are formed using the interferometer 800) to enter the alignment sensor optics with the same polarization. This is particularly advantageous since it allows the interferometer to be combined with optics for existing position detectors which may alter the polarization state of an input measurement radiation beam and/or whose output may be dependent on the polarization state of an input radiation beam.

In contrast, an interferometer comprising a polarizing beam splitter may split an input radiation beam into the two portions having orthogonal polarization states. An advantage of such an arrangement is that substantially all of the input radiation can be used to form an interference pattern. However, the use of such a polarizing interferometer is that the two portions would enter the alignment sensor optics with the orthogonal polarization states. Such an arrangement would not be compatible with an the alignment sensor substantially as described above with reference to FIGS. 7A and 7B. It will be appreciated that using the interferometer 800 comprising a beam splitter 802 that is polarization independent, each time either the first or second portion of the radiation is incident on the polarization independent beam splitter 802 approximately half of the radiation is lost (and does not propagate on to form part of the first or second portion). Therefore, using an interferometer 800 comprising a beam splitter 802 that is polarization independent will result in a signal being a factor of 8 smaller than would be achieved using a polarizing beam splitter (since each of the first and second portions if incident on the polarization independent beam splitter 802 three times).

It will be appreciated that a radiation source is a source operable to emit radiation, for example electromagnetic radiation. The radiation may comprise visible light. Therefore, it will be appreciated that the term "radiation" may be synonymous with the term "light".

Although specific reference has been made to the alignment method being used with position measurement apparatus, it is to be understood that the methods described herein may also be used to measure overlay between multiple layers of a substrate. For example, the methods may be applied when measuring an overlay between coarse and fine features of different layers of a substrate.

Although specific reference may be made in this text to embodiments of the invention in the context of a lithographic apparatus, embodiments of the invention may be used in other apparatus. An apparatus according to embodiments of the present invention may, for example, be used for medical applications, for example as part of a metrology system within a medical device. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

It should be understood that the processing unit PU which controls alignment sensor, processes signals detected by it, and calculates from these signals position measurements suitable for use in controlling the lithographic patterning process, will typically involve a computer assembly of some kind, which will not be described in detail. The computer assembly may be a dedicated computer external to the lithographic apparatus, it may be a processing unit or units dedicated to the alignment sensor or, alternatively, it may be a central control unit LACU controlling the lithographic apparatus as a whole. The computer assembly may be arranged for loading a computer program product comprising computer executable code. This may enable the computer assembly, when the computer program product is downloaded, to control aforementioned uses of a lithographic apparatus with the alignment sensor AS.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including infrared radiation (e.g. having a wavelength between 800 nm-2.5 µm), visible ration (e.g. having a wavelength between 380 nm-800 nm), ultraviolet (UV) radiation (e.g. having a wavelength of 365, 248, 193, 157 or 126 nm) and extreme ultra-violet (EUV) radiation (e.g. having a wavelength in the range of 5-20 nm). In the context of exposure of a substrate, for example using the lithographic apparatus shown in FIG. 1A, the terms "radiation" and "beam" may include: ultra-violet (UV) radiation (e.g. having a wavelength of 365, 248, 193, 157 or 126 nm) and extreme ultra-violet (EUV) radiation (e.g. having a wavelength in the range of 5-20 nm) and particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An apparatus comprising:
a measurement radiation source operable to produce measurement radiation for irradiating a top surface of an object;
a measurement radiation delivery system operable to guide the measurement radiation to the object to irradiate at least a part of the top surface of the object with the measurement radiation;
a measurement system operable to receive at least a portion of the measurement radiation scattered from the top surface of the object and to determine a characteristic of a feature of the object from at least a portion of the measurement radiation scattered from the top surface
a pump radiation source operable to produce pump radiation; and
a pump radiation delivery system operable to irradiate the top surface of the object with the pump radiation so as to produce a mechanical response in the object.

2. The apparatus of claim 1, wherein the measurement radiation delivery system and the pump radiation delivery system are configured such that an angle of incidence of the pump radiation at an object plane is different from an angle of incidence of the measurement radiation at the object plane.

3. The apparatus of claim 1, wherein the pump radiation delivery system is configured such that the pump radiation is incident on an object plane at a non-zero angle of incidence.

4. The apparatus of claim 1, wherein the pump radiation delivery system comprises an optical fiber.

5. The apparatus of claim 1, further comprising:
a controller, the controller being operable to control the measurement radiation source and the pump radiation source, and wherein the controller is operable to operate in either a first operational mode when the pump radiation source is not producing pump radiation or a second operational mode when the pump radiation source is producing pump radiation at least part of the time.

6. The apparatus of claim 5, wherein:
the measurement radiation source is operable to produce first measurement radiation or second measurement radiation; and
the controller is operable to control the measurement radiation source to produce the first measurement radiation when operating in the first operational mode and to control the measurement radiation source to produce the second measurement radiation when operating in the second operational mode.

7. The apparatus of claim 1, wherein an angular distribution of measurement radiation from which the measurement radiation system determines the characteristic of the feature of the object, is controllable.

8. The apparatus of claim 7, wherein the controller is operable to control the angular distribution of measurement radiation from which the measurement radiation system determines the characteristic of the feature of the object such that the characteristic of the feature of the object is determined from a first angular distribution when the controller is operating in the first operational mode and from a second angular distribution when the controller is operating in the second operational mode.

9. The apparatus of claim 1, wherein a sensitivity of a sensor of the measurement system to noise is controllable.

10. The apparatus of claim 1, wherein the measurement radiation delivery system comprises an interferometer having a first optical path and a second optical path, the interferometer comprising a polarization independent beam splitter arranged to:
receive the measurement radiation from the measurement radiation source;
generate from the measurement radiation:
a first portion that is directed along the first optical path then irradiates, and scatters from, a surface of the object, and is then directed along the second optical path and
a second portion that is directed along the second optical path then irradiates, and scatters from, a surface of the object, and is then directed along the first optical path; and
recombine the first and second portions of the measurement radiation to form output radiation;
wherein the characteristic of the feature of the object is determined in dependence on the output radiation.

11. A lithography apparatus comprising:
an illumination system configured to illuminate a pattern of a patterning device;
a projection system configured to project an image of the pattern onto an object and an apparatus comprising:
a measurement radiation source operable to produce measurement radiation for irradiating a top surface of the substrate;
a measurement radiation delivery system operable to guide the measurement radiation to the object to irradiate at least a part of the top surface of the object with the measurement radiation;
a measurement system operable to receive at least a portion of the measurement radiation scattered from the top surface of the object and to determine a characteristic of a feature of the object from at least a portion of the measurement radiation scattered from the top surface;

a pump radiation source operable to produce pump radiation; and a pump radiation delivery system operable to irradiate the top surface of the object with the pump radiation so as to produce a mechanical response in the object.

12. A method comprising:

producing measurement radiation using a measurement radiation source for irradiating a top surface of an object guiding the measurement radiation to the object using a measurement radiation delivery system to irradiate at least a portion of the top surface with the measurement radiation;

producing pump radiation using a pump radiation source;

guiding the pump radiation to irradiate the top surface of the object using a pump radiation delivery system so as to produce a mechanical response in the object before the top surface of the object is irradiated with the measurement radiation;

receiving at least a portion of the measurement radiation scattered from the top surface at a measurement system; and determining a characteristic of a feature of the object from at least a portion of the measurement radiation scattered from the top surface.

13. The method of claim 12, wherein when the top surface of the object is irradiated by the pump radiation, an angle of incidence of the pump radiation at the top surface of the object is different from an angle of incidence of the measurement radiation at the top surface of the object.

14. The method of claim 12, wherein when the top surface of the object is irradiated by the pump radiation, the pump radiation is incident on the top surface of the object at a non-zero angle of incidence.

15. The method of claim 12, wherein: a temporal duration of pulses of the measurement radiation and the pump radiation is substantially the same.

16. The method of claim 12, further comprising controlling an angular distribution of the measurement radiation.

17. An apparatus comprising:

a measurement radiation source operable to produce measurement radiation for irradiating a top surface of an object;

a polarization independent interferometer having a first optical path and a second optical path, the interferometer comprising a polarization independent beam splitter arranged to:

receive the measurement radiation from the measurement radiation source;

generate from the measurement radiation a first portion that is guided along the first optical path then irradiates, and scatters from, a surface of the object, and is then guided along the second optical path and a second portion that is guided along the second optical path then irradiates, and scatters from, a surface of the object, and is then guided along the first optical path; and recombine the first and second portions of the measurement radiation to form output radiation;

a pump radiation source operable to produce pump radiation for irradiating the top surface of the object with the pump radiation so as to produce a mechanical response in the object; and a measurement system operable to receive the output radiation and to determine a characteristic of a feature of the object in dependence thereon.

18. A method comprising:

producing measurement radiation using a measurement radiation source for irradiating a top surface of an object;

directing the measurement radiation to a polarization independent interferometer having a first optical path and a second optical path, the interferometer comprising a polarization independent beam splitter;

generating from the measurement radiation a first portion that is guided along the first optical path then irradiates, and scatters from, a surface of the object, and is then guided along the second optical path and a second portion that is guided along the second optical path then irradiates, and scatters from, a surface of the object, and is then guided along the first optical path; and producing pump radiation and irradiating a top surface of the object with the pump radiation so as to produce a mechanical response in the object, the pump radiation irradiating the top surface of the object after the first portion of the measurement radiation and before the second portion of the measurement radiation;

recombining the first and second portions of the measurement radiation to form output radiation; and determining a characteristic of a feature of the object in dependence on a temporal portion of the output radiation, the temporal portion corresponding to a portion of the output radiation that corresponds to a time taken to propagate along the first optical path, irradiate and scatter from the surface of the object, and propagate along the second optical path.

\* \* \* \* \*

UNITED STATES PATENT AND TRADEMARK OFFICE
CERTIFICATE OF CORRECTION

PATENT NO. : 10,942,461 B2  
APPLICATION NO. : 16/639566  
DATED : March 9, 2021  
INVENTOR(S) : Huisman et al.

Page 1 of 1

It is certified that error appears in the above-identified patent and that said Letters Patent is hereby corrected as shown below:

In the Claims

In Column 47, Line 46, Claim 1 replace "face" with --face;--.

In Column 48, Line 57, Claim 11 replace "object and an" with --object; and an--.

In Column 49, Line 12, Claim 12 replace "object" with --object;--.

In Column 50, Line 34, replace Claim 18 "first optical path; and" with --first optical path;--.

Signed and Sealed this  
Thirteenth Day of July, 2021

Drew Hirshfeld  
*Performing the Functions and Duties of the*  
*Under Secretary of Commerce for Intellectual Property and*  
*Director of the United States Patent and Trademark Office*